United States Patent
Banaska et al.

[11] Patent Number: 5,918,194
[45] Date of Patent: Jun. 29, 1999

[54] INTEGRATED MODULAR MEASUREMENT SYSTEM HAVING CONFIGURABLE FIRMWARE ARCHITECTURE AND MODULAR MECHANICAL PARTS

[75] Inventors: John Banaska, No. Royalton; David J. Howarth, Lakewood; Michael P. Minneman, Hudson; Bob Spinks, Bedford, all of Ohio; K.S. Bhaskar, Sharon, Mass.

[73] Assignee: Keithley Instruments, Inc., Cleveland, Ohio

[21] Appl. No.: 08/905,064

[22] Filed: Aug. 1, 1997

Related U.S. Application Data

[60] Provisional application No. 60/023,098, Aug. 1, 1996, and provisional application No. 60/023,387, Aug. 1, 1996.

[51] Int. Cl.⁶ .............................. G01R 1/00; G01R 19/25
[52] U.S. Cl. .................... 702/91; 702/47; 340/825.06
[58] Field of Search .................... 702/91, 127–128, 702/47; 364/921.8, 926; 340/825.06, 825.08; 361/683, 684

[56] References Cited

U.S. PATENT DOCUMENTS

| | | | |
|---|---|---|---|
| 4,503,707 | 3/1985 | Rosa et al. | 702/50 |
| 5,062,101 | 10/1991 | Dejewski | 359/135 |
| 5,068,850 | 11/1991 | Moore | 340/825.08 |
| 5,159,534 | 10/1992 | Hudson et al. | 361/683 |
| 5,335,186 | 8/1994 | Tarrant | 702/127 |
| 5,375,073 | 12/1994 | McBean | 702/91 |
| 5,576,972 | 11/1996 | Harrison | 702/128 |

*Primary Examiner*—John Barlow
*Assistant Examiner*—Bryan Bui
*Attorney, Agent, or Firm*—Renner, Otto, Boisselle & Sklar, P.L.L.

[57] ABSTRACT

An integrated modular measurement system includes a universal module which is operable to receive measurement data from one or more measurement sensors, convert the measurement data into a value that represents a characteristic being measured and indicate the value to a user in a plurality of signal formats. An input module is coupled to the universal module and is operable to house one or more measurement sensors. The universal module and input module together operate to provide versatile measurement acquisition. A custom calibrated sensor module includes one or more sensors and a memory associated with and local to the one or more sensors. The memory contains calibration information which is uniquely associated with the sensors. In taking a measurement, the calibration information associated with the sensor taking the measurement is accessible for conversion instructions to thereby improve conversion accuracy. A method of interfacing a universal module to a plurality of measurement sensors includes coupling one of the measurement sensors to the universal module and identifying the measurement sensor being used. In addition, the universal module is configured in response to the identification of the measurement sensor to thereby facilitate accurate and versatile measurement acquisition for a plurality of measurement sensors.

43 Claims, 19 Drawing Sheets

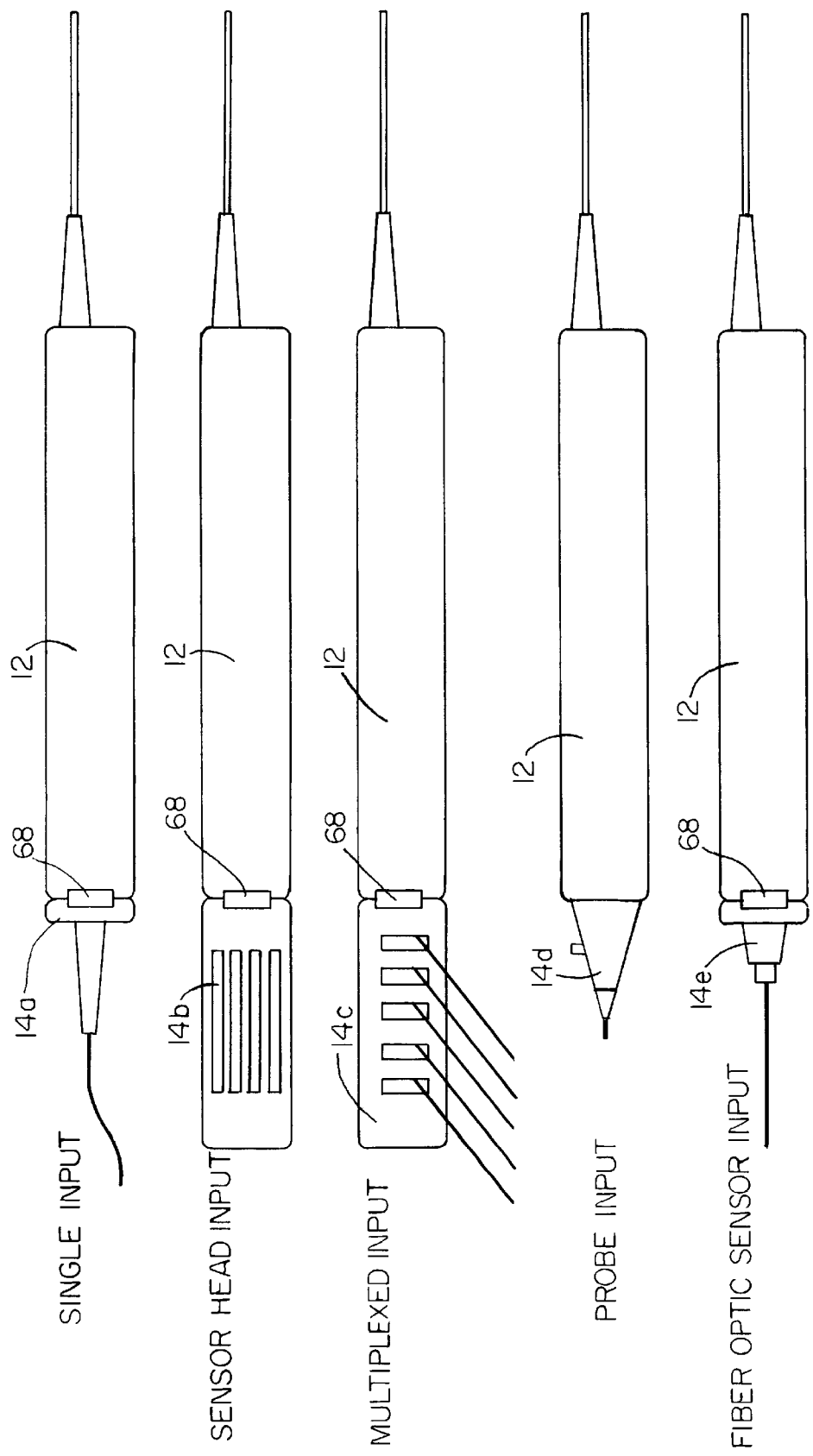

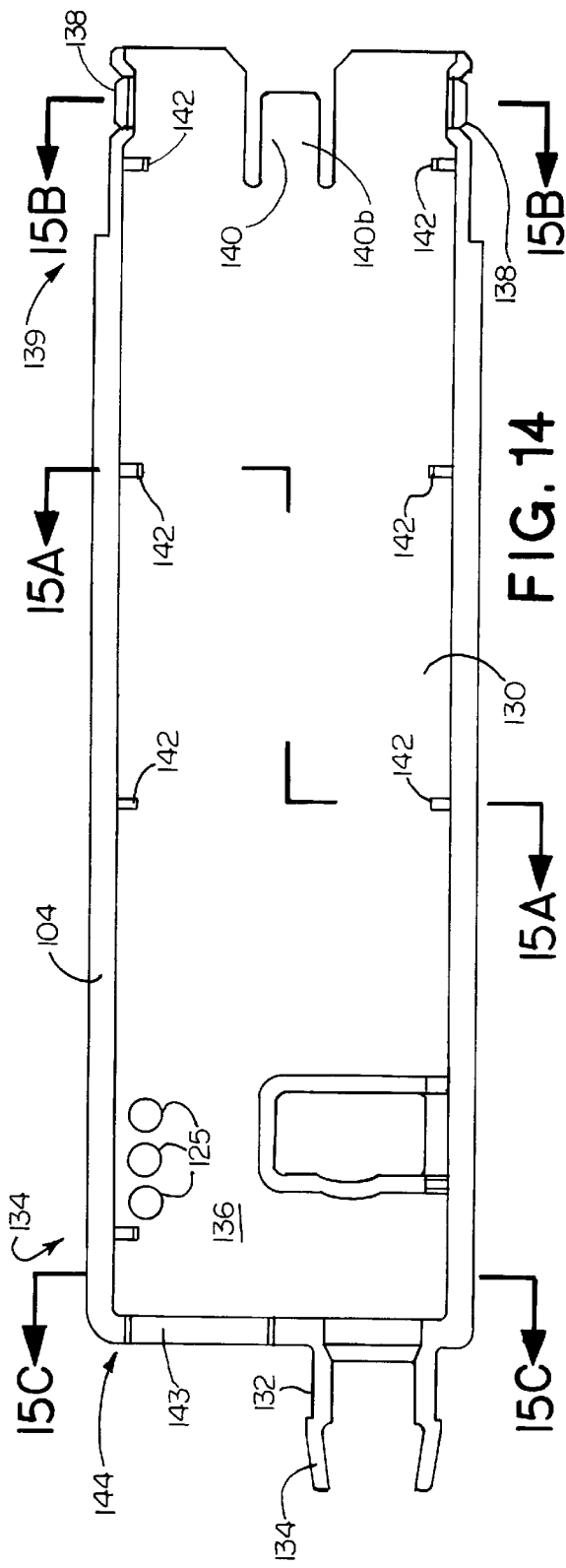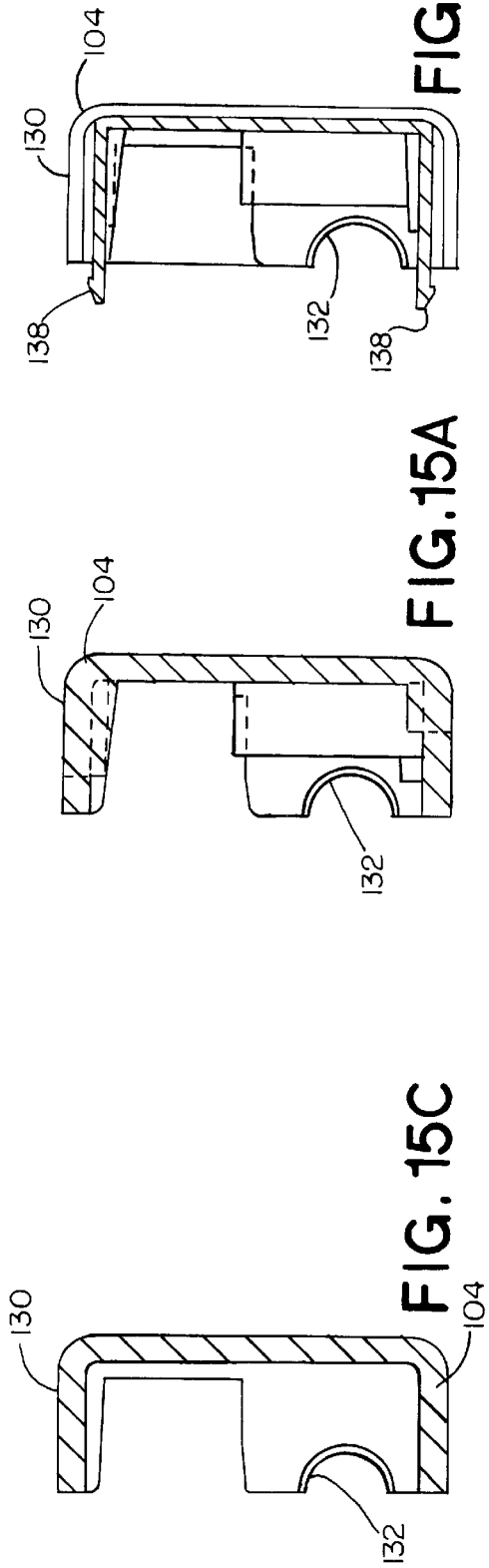

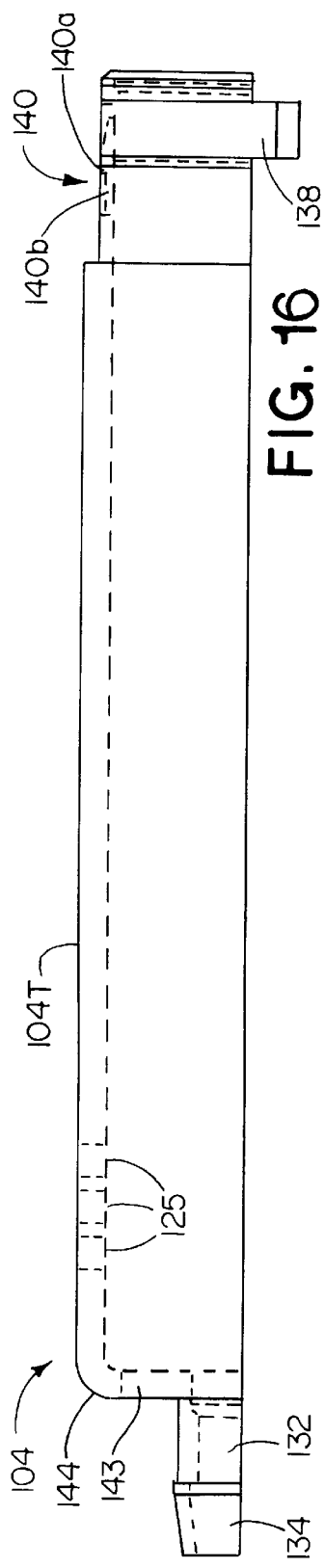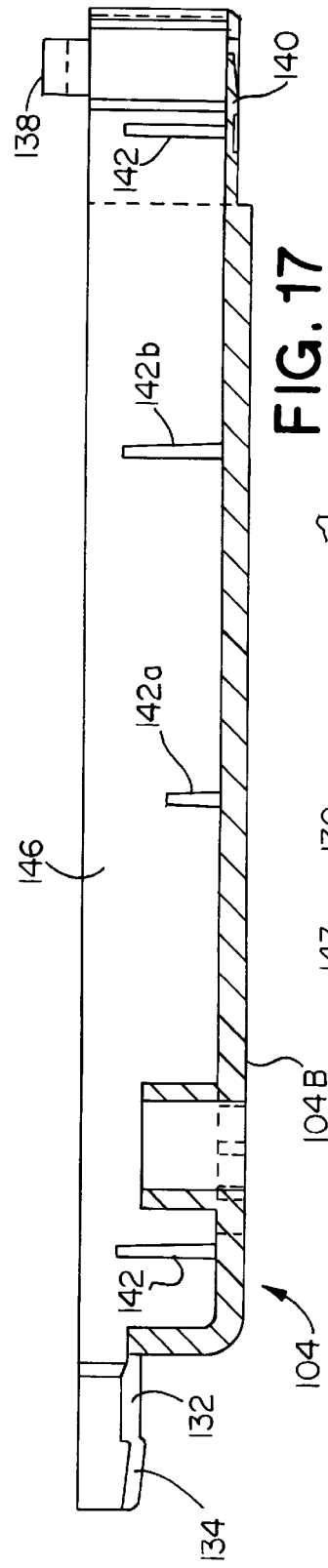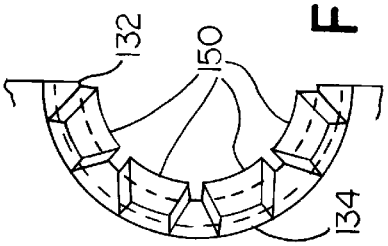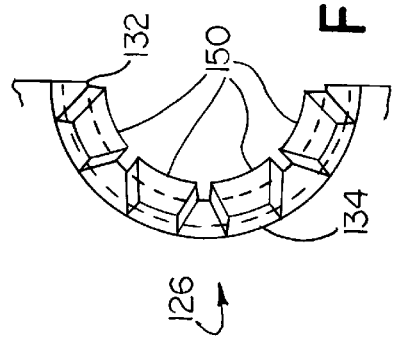

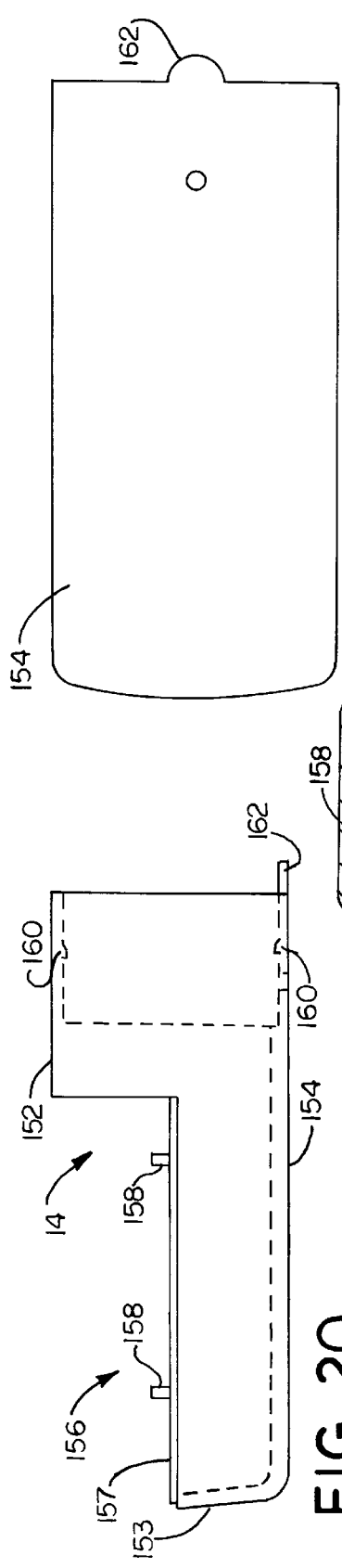
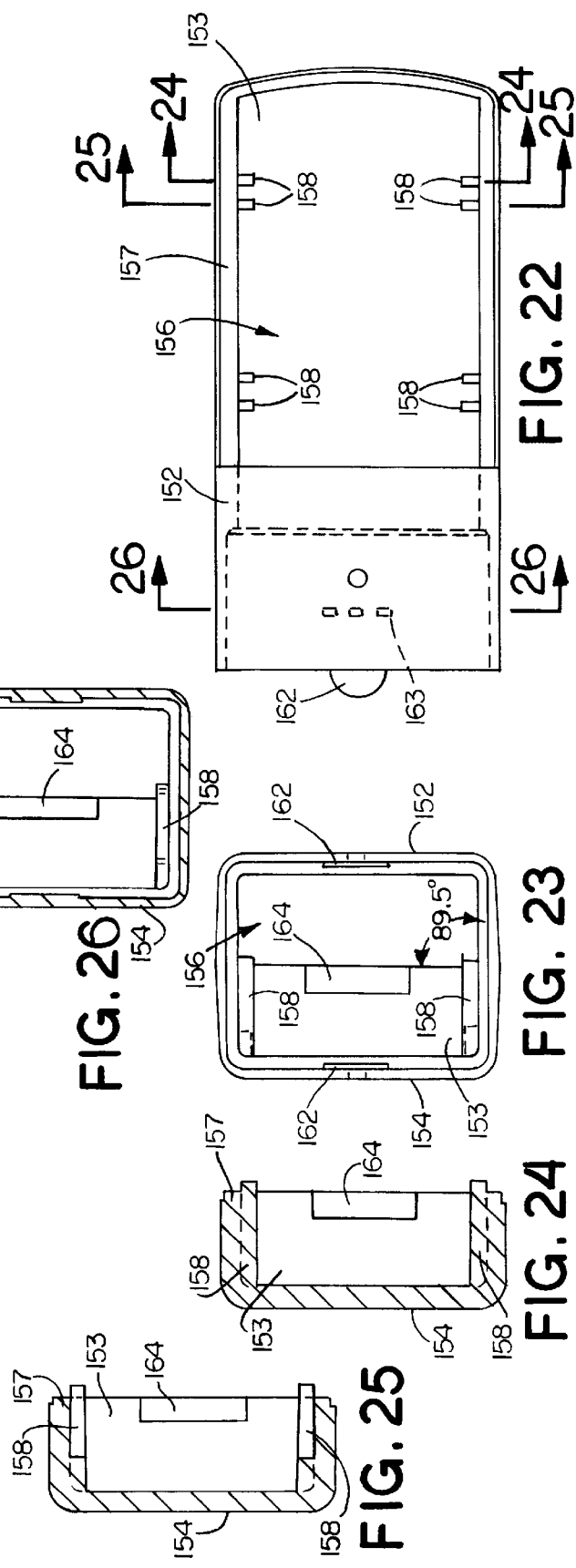

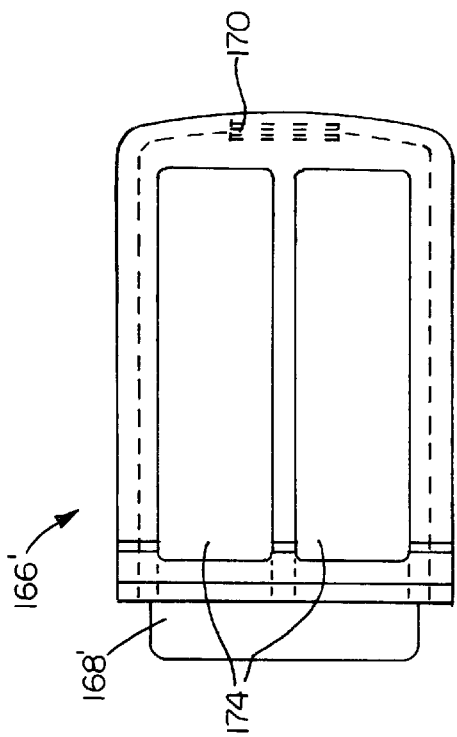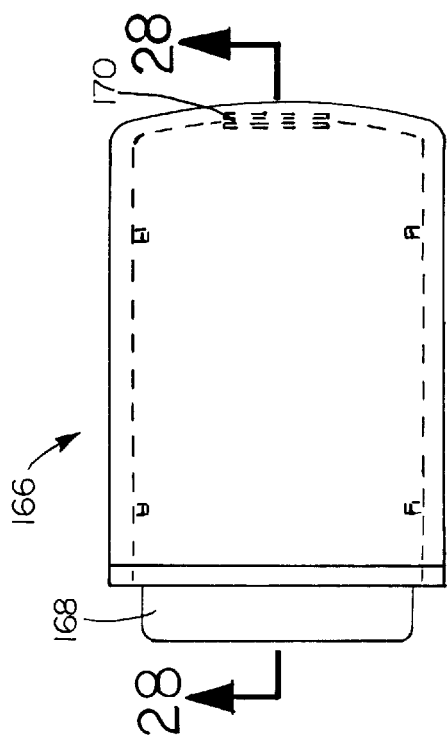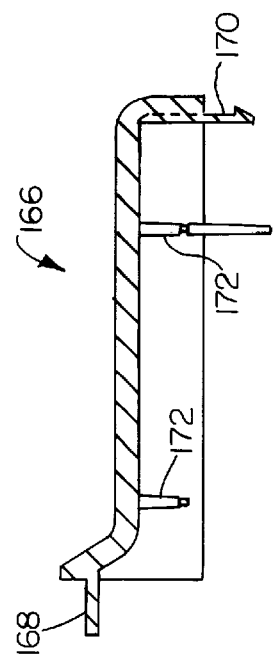

5,918,194

INTEGRATED MODULAR MEASUREMENT SYSTEM HAVING CONFIGURABLE FIRMWARE ARCHITECTURE AND MODULAR MECHANICAL PARTS

This application claims the benefit of U.S. Provisional Application Nos.: 60/023,098, filed Aug. 1, 1996 and 60/023,387, filed Aug. 1, 1996, which are hereby incorporated by reference in their entirety.

FIELD OF THE INVENTION

This invention generally relates to measurement systems. More particularly, the invention relates to an integrated modular measurement system having configurable firmware and modular mechanical parts.

BACKGROUND OF THE INVENTION

In commercial applications, one often wishes to measure a variety of application characteristics or parameters, ambient conditions, etc. In many cases, one must purchase a separate measurement system to measure each desired parameter. or example, one may wish to measure the temperature as well as the humidity, voltage, electrical or magnetic field, torque, or other type process parameters. The purchase of separate measurement systems to measure each of the above process characteristics make such measurements costly.

Additionally, one may wish to measure a particular parameter or to measure that parameter within a specific parameter range or under specific parameter conditions. Further, it is often desirable to communicate the measured information within a certain computer or communications protocol. Prior art systems communicated in various ways. In one way, a user purchases a custom measurement system that is specifically designed solely for that particular range of process characteristics the user has d sired. Another system includes purchasing a measurement system that is operable not only for your particular process characteristic range, but also is operable over a broad range of process characteristics. Yet another prior art system requires the purchase of measurement system that particularly communicates within the desired communication protocol. Therefore a user must either purchase a highly custom measurement system to measure and communicate the information, thereby resulting in substantially high costs or must purchase a measurement system that is operable over a needlessly broad range of process characteristics. In this scenario one sacrifices either performance (the resolution and/or accuracy of the measuring of the particular parameter) or cost in obtaining high resolution performance over a range of measurement broader than needed. In either case the user is in the predicament either spending a substantial amount of money to purchase a custom measurement system uniquely tailored to their needs, or alternatively paying a substantial amount of money to purchase a measurement system that provides functions that they do not desire and fails to provide the accuracy for the particular function they do need. Therefore, users are faced with a quandary of either paying great cost to meet their needs, or sacrificing the accuracy in measurements for their desired parameters.

Another problem in measurement systems is the sensor being utilized is either not calibrated or, if calibrated, its calibration is a function of a nominal sensor of its kind. Therefore, measurement systems do not have sensors that are uniquely calibrated for that particular sensor and/or for the sensor's use, thereby negatively impacting measurement accuracy.

Additional inaccuracies also occur due to measurement systems which have conversion capabilities remote from the sensor itself. In prior art systems, a measurement is taken by the sensor, which provides an electrical signal which is indicative of the measurement being taken. That signal is subsequently transferred along some type of communication wiring harness or cable to a remote location where that signal is then converted into its respective measurement value. The transfer along the cable or wire often creates inaccuracies due to loses which occur along the line. Therefore, the electronic signal value at the location of the sensor is often not the same electronic signal value at the remote conversion circuitry site. It further creates measurement inaccuracies.

Yet another problem facing users of measurement systems is that the software utilized within conversion circuitry is generic and does not meet the unique needs of the user. Prior art solutions to this problem include the user creating their own custom software to provide their desired features, which increases the cost to the user as well as takes time. Further, adding additional software oftentimes requires making modifications to the conversion circuitry by either adding additional memory or altering the system architecture, etc. These tasks further increase the cost of utilizing the measurement system.

SUMMARY OF THE INVENTION

In one aspect of the invention, an integrated modular measurement system includes a universal measurement control and communications module (or body portion) which is operable to receive measurement data from a plurality of different measurement sensors or from any one or any one type of measurement sensor. the body is operable to convert the measurement data from each measurement sensor into a value that represents a characteristic being measured and is also able to communicate that value to a user in a plurality of communication formats. The integrated modular measurement system includes an input module which is coupled to the body portion. The input module is operable to house at least one of a plurality of measurement sensors. The universal measurement control and communication module coupled with the input module facilitates versatile measurement acquisition.

In another aspect of the invention, a configurable measurement control and communication module includes a motherboard having an analog core circuit. The analog core circuit performs signal conditioning as well as signal conversion and control interface operations in conjunction with an input module. The motherboard has a plurality of socket connectors for connection to one of a plurality of digital core circuits and one of a plurality of communications interface circuits. The plurality of digital core circuits connect to the motherboard and convert measurement data from any of a plurality of measurement sensors into a value that represents the characteristic being measured. The digital core circuits also contain operating firmware for multiplexing control, control algorithms, and data conversion and measurement control functions. The plurality of communications interface circuits are operable to communicate converted data from the digital core circuits to users or a remote, centralized location using the appropriate communication protocol. The communications interface circuits may each contain a unique transceiver to effectuate communication using a unique communication protocol. The plurality of communication circuits are operable to provide communication of information using various protocols such as ethernet, RS-232, RS-422, RS-485 and parallel port communication.

The plurality of communications interface circuits also provide for reading of data either locally or remotely. The measurement control and communications module is configurable to enable the motherboard to interface with one of a plurality of digital core circuits and to one of a plurality of communications interface circuits, thereby providing multiple options in terms of measurement and control as well as conversion, in addition to the communication protocol format.

In another aspect of the invention, a method of interfacing a universal measurement conversion circuit to a plurality of measurement sensors includes the step of coupling one of the plurality of measurement sensors to the conversion circuit, and accessing a signature of the one of the measurement sensors, wherein the signature identifies the type, characteristic and/or use of the measurement sensor. The method also includes the step of configuring the conversion circuit to interface with the identified measurement sensor, and transferring the data from the identified measurement sensor to the conversion circuit for conversion of the data into a value which represents a characteristic being measured.

In yet another aspect of the invention, a custom calibrated sensor module includes a sensor and a memory coupled to the sensor. The memory contains stored calibration information uniquely associated with the sensor. The calibration information is derived from the calibration of the sensor prior to its use. In use, the memory, coupled to the sensor, downloads the calibration information to conversion circuitry for use in subsequent conversion of electrical signals from the sensor, thereby providing an accurate calculation of measurement data into a value which accurately represents the characteristic being measured.

In a further aspect of the invention, a measurement system having local conversion and display capability includes a sensor attached to a handheld fixture, and a conversion circuit coupled to the sensor. The conversion circuit is also attached to the handheld fixture and provides conversion of an electrical signal to a measurement value at a site local to the measurement. The conversion capability at a site local to the measurement eliminates line losses prior to conversion which are associated with remote conversion circuits.

In another aspect of the invention, a configurable firmware architecture is provided for measurement and communications functions. The configurable firmware architecture includes a memory having common firmware, wherein the common firmware provides instructions which are common to many measurement applications, such as requests for maximum and minimum measurements as well as the setting of limits, etc. The configurable firmware architecture also includes analog control firmware which is configurable to effectuate a plurality of specific user commands. Such analog control firmware includes control instructions, interface instructions with a plurality of measurement sensors, unique signal conditioning, etc. The configurable firmware architecture also includes a plurality of communications firmware instructions. The plurality of communications instructions allows a user to identify the appropriate communications interface to be utilized. The plurality of communications instructions take conversion data from a processor and communicate that information to users via a plurality of communication protocols. The configurable firmware architecture provides flexibility to effectuate a plurality of unique measurement needs. The configurable firmware architecture may also be upgraded through a connection to a remote computer.

To the accomplishment of the foregoing and related ends the invention, then, comprises the features hereinafter fully described. The following description and the annexed drawings set forth in detail certain illustrative embodiments of the invention. These embodiments are indicative of but a few of the various ways in which the principles of the invention may be employed.

BRIEF DESCRIPTION OF THE DRAWINGS

In the annexed drawings:

FIG. 10 is a pictorial diagram illustrating a plurality of different input modules being utilized with the universal measurement control and communications module;

FIG. 14 is a top view illustrating the top portion of the universal measurement control and communications module;

FIG. 15a is a cross-section taken along the dotted line A—A of FIG. 14;

FIG. 15b is a cross-section taken along the dotted line B—B of FIG. 14;

FIG. 15c is a cross-section taken along the dotted line C—C of FIG. 14;

FIG. 16 is a side view illustrating the top half of the universal measurement control and communications module;

FIG. 17 is a side view illustrating the bottom half of the universal measurement control and communications module;

FIG. 18 is a partial front view of the universal control and communications module showing the strain relief for a communications cord;

FIG. 19 is an enlarged view of the strain relief for a communications cord illustrating a crimped portion having flexible teeth;

FIG. 20 is a side view illustrating the input module of the integrated modular measurement system;

FIG. 21 is a bottom view of the input module;

FIG. 22 is a top view of the input module;

FIG. 23 is a front view of the input module;

FIG. 24 is a cross-section taken along the dotted line A—A of FIG. 22;

FIG. 25 is a cross-section taken along the dotted line B—B of FIG. 22;

FIG. 26 is a cross-section taken along the dotted line C—C of FIG. 22;

FIG. 27 is a top view of the cut-away cover which shields the sensor(s) within the input module;

FIG. 28 is a side cross-section of the cut-away cover; and

FIG. 29 is a top view of a cut-away cover having holes for multiple input sensors.

DETAILED DESCRIPTION OF THE INVENTION

Figure 1:
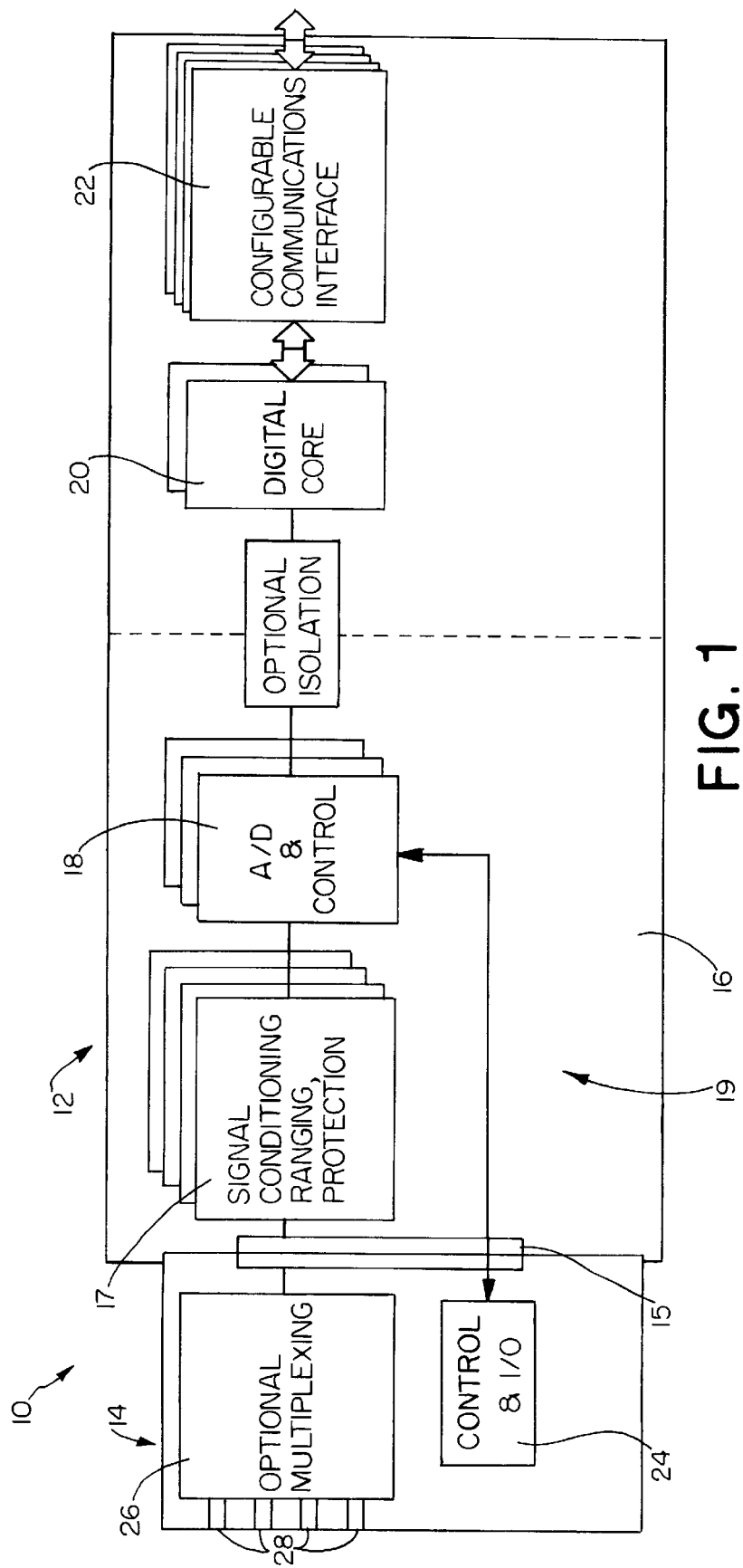
FIG. 1 is a block diagram illustrating an integrated modular measurement system of the invention.

An integrated modular measurement system 10, which is shown in FIG. 1, for example, couples a universal measurement control and communications module (or body) 12 to an input module 14 which includes one or a plurality of measurement sensors. The body 12 (it will be appreciated that reference to "body" includes the circuitry components therein, for example) is operable to identify the type of measurement sensor associated with the input module 14 and its form of use to convert measurement data from each measurement sensor into a value that represents the characteristic or parameter being measured. The body is also configurable by having a motherboard which may interface with a plurality of digital core circuits, which perform conversion functions, and with a plurality of communication interface circuits, which communicate converted measurement data either remotely or locally in numerous communication formats.

The integrated modular measurement system 10 provides improved accuracy by calibrating the sensor prior to its use in the system. The calibration procedure provides calibration constants which are unique to the sensor and which are stored in a memory associated with the sensor. During measurement data conversion, the calibration constants are downloaded and utilized to accurately convert the measurement data into a value which represents the measured parameter. The measurement data conversion is performed local to the sensor, thereby eliminating substantial line loss in remote converters. The converted data can be communicated in digital format to a remote location, such as a computer at a different location from the measurement system 10.

The integrated modular measurement system 10 also allows for a configurable firmware architecture which provides for a plurality of conversion, conditioning and communication options. The firmware is also easily upgraded, thereby allowing firmware modifications to effectively reconfigure associated hardware and lowering measuring costs.

FIG. 1 is a block diagram illustrating an integrated modular measurement system 10. The integrated modular measurement system 10 includes the universal measurement control and communications module (or body) 12 connected to an input module 14 via a connector 15. Included in the body 12 is a motherboard 16 containing a signal conditioning circuit 17 and an analog-to-digital & control circuit 18. The signal conditioning circuit 17 and the analog-to-digital & control circuit 18 comprise an analog core portion 19 of the motherboard 16. Coupled to the motherboard 16 via connectors is a digital core circuit 20 and a communications interface circuit 22. The input module 14 contains a control circuit 24 coupled to the analog-to-digital & control circuit 18 of the motherboard 16 via the connector 15 and a multiplexer 26 which is coupled to the signal conditioning circuit 17 via the connector 15 as well. The multiplexer 26 is further coupled to a plurality of sensors 28, wherein the sensors 28 take the measurement of interest and communicate measurement data, via the input module 14, to the body portion 12.

The multiplexer 26 is optional, for example, to the extent that the input module 14 may utilize a plurality of sensors 28. In utilizing a plurality of sensors 28, the multiplexer 26 selectively couples one (or selected ores) of the plurality of sensors 28 at any one time to the signal conditioning circuit 17 of the body portion 12. Alternatively, the input module unit 14 may utilize a single sensor 28 in which case the multiplexer may not be necessary.

Control circuit 24, within the input module 14, provides digital control signals to the sensors 28, to communicate that a measurement is to be taken. The control circuit 24 also performs local signal conditioning to the electric signals which are byproducts of the sensors 28. Such signal conditioning may include providing an offset for the electric signal, providing a correction for the electric signal or other type signal conditioning functions. The control circuit 24 also interfaces with the analog-to-digital & control circuit 18 of body portion 12 to synchronize the transfer of the electric signal or signals (measurement data) from the sensors to the body portion 12 and to communicate which sensor 28 (if a plurality of sensors 28 exist) is providing the data. The body portion 12 receives the measurement data consisting of an analog voltage signal from the input module 14 via the signal conditioning circuit 17. The signal conditioning circuit 17 performs additional signal conditioning processes on the electric signal such as performing an auto ranging function as well as performing voltage spike protection as well as noise filtering. These conditioning processes may be configurable, thereby further improving the system flexibility.

The electric signal is then transferred to the analog-to-digital & control circuit 18 which communicates back to the input module 14 that it has received the signal and subsequently converts the analog electric signal to a digital signal (or word) that can be utilized subsequently within the body portion 12. The analog-to-digital and control . circuit 18 also performs a function of looking to the control circuit 24 of the input module to read a sensor type signature signal which then identifies the type of sensor 28 being utilized within the input module 14. The analog-to-digital and control circuit 18 then communicates the type of sensor being used to the digital core circuit 20. The digital signal is transferred to the digital core circuit 20 which takes the digital signal and converts it into a value which is representative of the measurement being taken. The digital core circuit 20 performs these conversions utilizing firmware which is stored in a memory (not shown) within the digital core circuit and any custom calibration constants, e.g., based on a previous calibrating of the particular sensor of the input module, that may be downloaded from the input module 14.

The communications interface circuit 22 then takes the converted value and communicates that value external to the body portion 12 through a particular communications protocol dictated by the communication interface circuit 22.

The motherboard 16 is configurable in that the digital core circuit 20 and the communications interface circuit 22 are physically connected to the motherboard 16 via a connector. Therefore, more than one type of digital core circuit 20 may be utilized. For example, one may wish to utilize a digital core circuit 20 which utilizes high resolution conversion techniques or algorithms or alternatively use a low performance digital core circuit 20 for standard-type measurement conversions. In this manner, a user may specify what type of digital core circuit 20 they wish to utilize, therefore, paying for only the performance they need. In a like manner, the communications interface circuit 22 is also connected to the motherboard 16 via a connector. One communications interface circuit 22 may be easily replaced by an alternative communications interface circuit 22 to provide different type communication interface protocols to end users. Examples of differing communication interface circuits 22 would include one using an ethernet communications protocol, or alternatively an RS-232 type communications protocol. Therefore a user may specify what form of communications protocol is desired, therefore, paying only for the features they want. Although in this particular embodiment, the signal conditioning circuit 17 is physically attached onto the motherboard 16, the signal conditioning circuit 17 could also be coupled to the motherboard 16 via a connector and also be configurable. Un some circumstances, it may be desirable to effectuate a unique form of signal conditioning. By utilizing the signal conditioning circuit 17 in a configurable manner, a user may specify that particular constraint and thereby pay for only the particular function they wish. An optional isolation block is coupled between the analog-to-digital control circuit 18 and the digital core circuit 20. The optional isolation block provides isolation with respect to noise and signal transients between the components physically on the motherboard 16 and those components coupled to the motherboard 15 via connectors. An alternative embodiment, this isolation block could be eliminated. The integrated modular measurement system 10 therefore utilizes the universal measurement control and communications module (body) 12 to effectuate a modular body portion wherein a user may specify, say to the manufacturer, one of a plurality of different components. A selection from a plurality of digital core circuits 20 and communication interface circuits 22 provides a broad range of measurement versatility. In addition, since the plurality of digital core circuits 20 and communications interface circuits 22 are provided as options, they may be produced in volume, thereby providing a low-cost, semi-custom type body portion 12 for measuring a plurality of system or application parameters. Also, due to the modularity of the invention, inventory requirements to maintain a suitable stock on-hand for prompt delivery of systems 10 to customers can be reduced.

Figure 2:
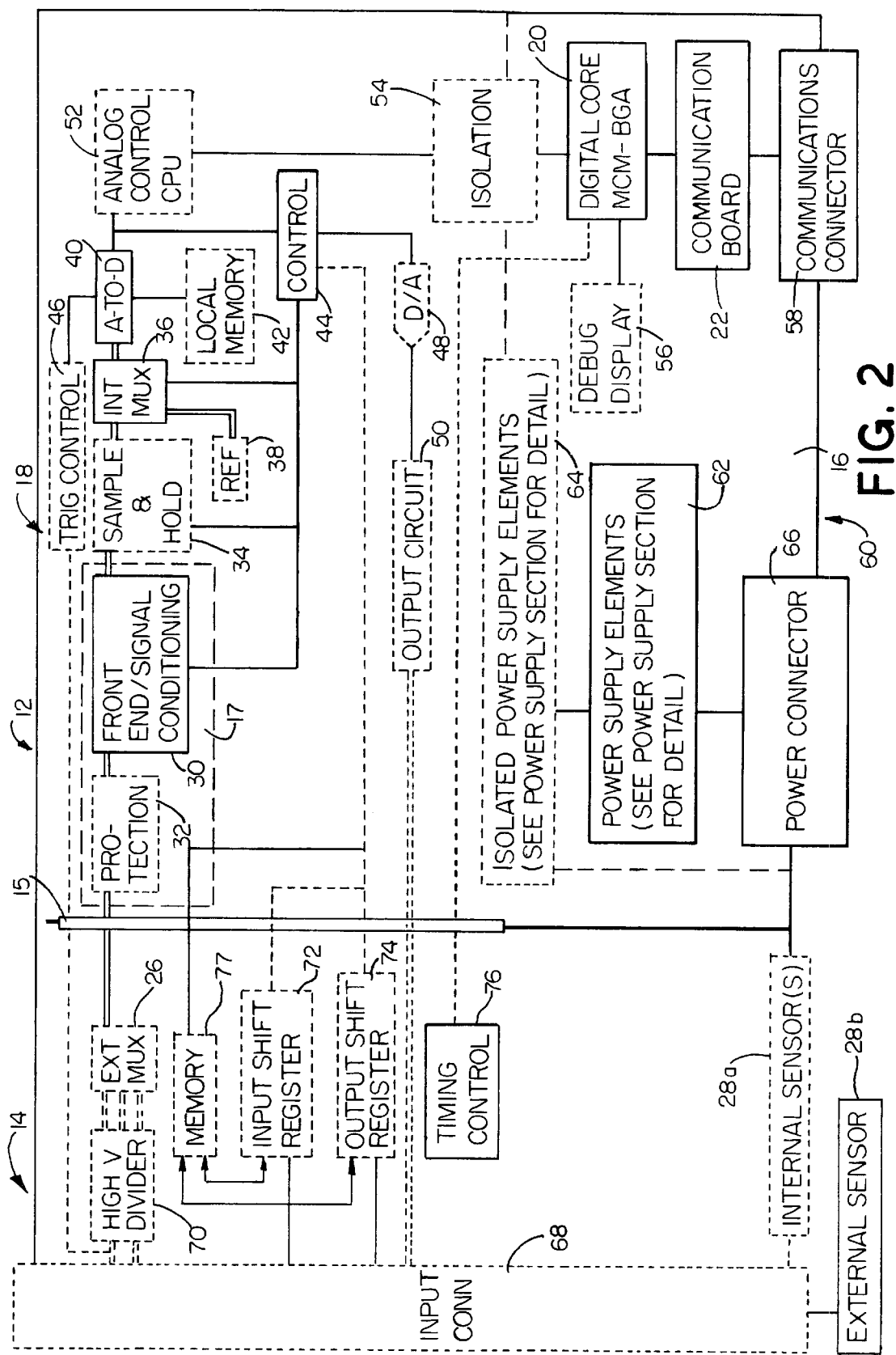
FIG. 2 is a block diagram illustrating, in greater detail, the integrated modular measurement system.

FIG. 2 is a block diagram illustrating in greater detail the integrated modular measurement system 10. The body portion 12 illustrates the signal conditioning circuit 17 having two components, a front end/signal conditioning circuit 30 and a protection circuit 32. The front end/signal conditioning circuit 30 performs the conditioning functions discussed above, and the protection circuit 32 provides protection from voltage transients, voltage spikes and system as noise. The analog-to-digital & control circuit 18 has a sample & hold circuit 34 coupled to a control multiplexer 36 which in turn is coupled to a reference circuit 38. An analog-to-digital converter 40 is coupled to the multiplexer 36 and a local memory 42. An analog-to-digital control circuit 44 is connected to the multiplexer 36, the sample and hold circuit 34, and the front end/signal conditioning circuit 30. A triggering control circuit 46 is coupled to the analog-to-digital converter 40 and the input module 14. A digital-to-analog converter 48 is coupled to the analog-to-digital control circuit 44 and an output interface circuit 50 which, in turn, is coupled to the input module 14.

The analog-to-digital & control circuit 18 operates generally in the following manner. The analog-to-digital and control circuit 44 monitors the front end/signal conditioning circuit 30; when a signal from the input module 14 (measurement data) has been adequately conditioned, the analog-to-digital control circuit 44 triggers the sample and hold circuit 34 to thereby ensure that the electrical signal that is conditioned is locked to avoid any subsequent voltage fluctuation. The control multiplexer 36 then selectively passes the filtered sampled analog signal or a reference signal from the reference circuit 38 to the analog-to-digital converter 40. The reference signal from the reference circuit 38 is used as a self-calibration for the analog-to-digital & control circuit 18. The analog-to-digital converter 40, upon selection of the measurement data by the control multiplexer 36, converts the analog signal into a digital signal. The converted digital signal (or binary word) is stored locally in the local memory 42. The analog-to-digital control circuit 44 monitors the actions of the analog-to-digital converter 40 and communicates back to the input module 14 that the data has been converted.

The analog-to-digital control circuit 44 may also take the digital signal and convert it back to an analog signal via the digital-to-analog converter 48 and pass the converted signal back to the input module 14 via the output circuit 50. The input module 14 compares the converted signal to its original analog signal (measurement data) counterpart for an automatic calibration.

The digitized measurement data is transferred, via the analog control CPU 52, off of the motherboard 16 to the digital core circuit 20. The digital core circuit 20 has a debug display 56 coupled to it, which provides a user a diagnostic display to debug the digital core circuit 20 as well as its firmware which is stored within the digital core circuit 20. In this manner, a user may debug the firmware operating instructions, if desired.

The communications interface circuit 22 has a communication connector 58 coupled to it. The communications connector 58 connects to the outside world to allow a computer or storage apparatus, using the appropriate communication interface protocol, to couple to the communications interface circuit 22.

The body portion 12 also has a power supply 60 having a power supply circuit 62 and a power supply isolation circuit 64 coupled to it. The power supply isolation circuit 64 electrically isolates the power supply circuit 62 from any potential voltage transients, etc. within the body portion 12 and/or received from an external power source, thereby helping to establish a stable power supply value. A power supply connector 66 is also connected to the power supply circuit 62 and allows connection to a power source, the outside world, in order to provide power to the body portion 12.

The input module portion 14 of FIG. 2 includes an input connector 68 to which the internal sensor 28 is coupled. A high voltage divider circuit 70 is coupled to the input connector 68 and provides a voltage divider network to scale the voltage signal representing the measurement data down to a level which standard circuitry can handle. The high voltage divider circuit 70 is connected to the multiplexer 26 which selectively passes one of a plurality of signals (if multiple measurements taken) from the high voltage divider network 70 to the body portion 12 of the integrated modular measurement system 10.

An input shift register 72 and an output shift register 74 are both coupled to the input connector 68 and to the analog-to-digital control circuit 44 of the body portion 12. The input shift register 72 and the output shift register 74 provide control information to the input module 14 for performance of additional measurements by the sensors 28, communicates the sensor type identity to the body portion 12 and also provides other information. A timing control circuit 76 is coupled to the digital core circuit 20 of the body portion 12 and provides synchronization between the input module 14 and the operations of the body portion 12.

FIG. 2 illustrates in greater detail how the integrated modular measurement system 10 provides for a modular body portion 12, thereby providing a user versatility in making substantially high accuracy measurements at a modest cost. The input module 14 is also operable to couple a plurality of different type sensors 28 to the body portion 12, thereby further improving the versatility of measurements that may be taken. When the input module 14 is coupled to the body portion 12, the analog-to-digital circuit 44 of the analog-to-digital & control circuit 18 reads the input shift register 72 and the output shift register 74 to identify a signal which represents the sensor signature of the sensor 28. Dn this manner, the analog-to-digital control circuit 44 may identify what type of sensor 28 is coupled to the input connector 68. The analog-to-digital control circuit 44 then communicates that sensor signature, via the analog control CPU 52, to the digital core circuit 20. The digital core circuit 20, via the firmware stored within it, then may configure itself appropriately to make the appropriate measurement conversion calculations.

A memory 77, such as an erasable memory, an example being an electrically erasable programmable read only memory (EEPROM), which may be part of the control and I/O circuitry 24 that also may include the shift registers 72, 74, may also be coupled within the input module 14 to the input connector 68. The memory may contain pre-programmed calibration constants which are specific to the particular sensor 28 within the input module 14. The pre-programmed calibration coefficients (or constants) may then be transferred from the memory within the input module 14 to the digital core circuit 20 via the analog-to-digital control circuit 44 and the analog control CPU 52, for utilization in the conversion of the digitized signal to a value which represents the measured characteristic or parameter. The pre-programmed calibration constants uniquely characterize the sensor 28 being utilized within the input module 14. The way in which the pre-programmed calibration constants are calculated requires a calibration procedure of the sensor 28 prior to its use. The sensor 28 would measure the appropriate characteristic over an appropriate range, wherein each value in the range is known. The measured characteristic is then compared against the known characteristic across that range and calibration constants are thereby calculated. The calibration constant (or constants) would then be downloaded into the memory associated with that particular sensor 28 for subsequent use. Having calibration constants which uniquely characterize the particular sensor 28 provides a higher degree a accuracy in subsequent calculations performed by the digital core circuit 20.

Figure 3:
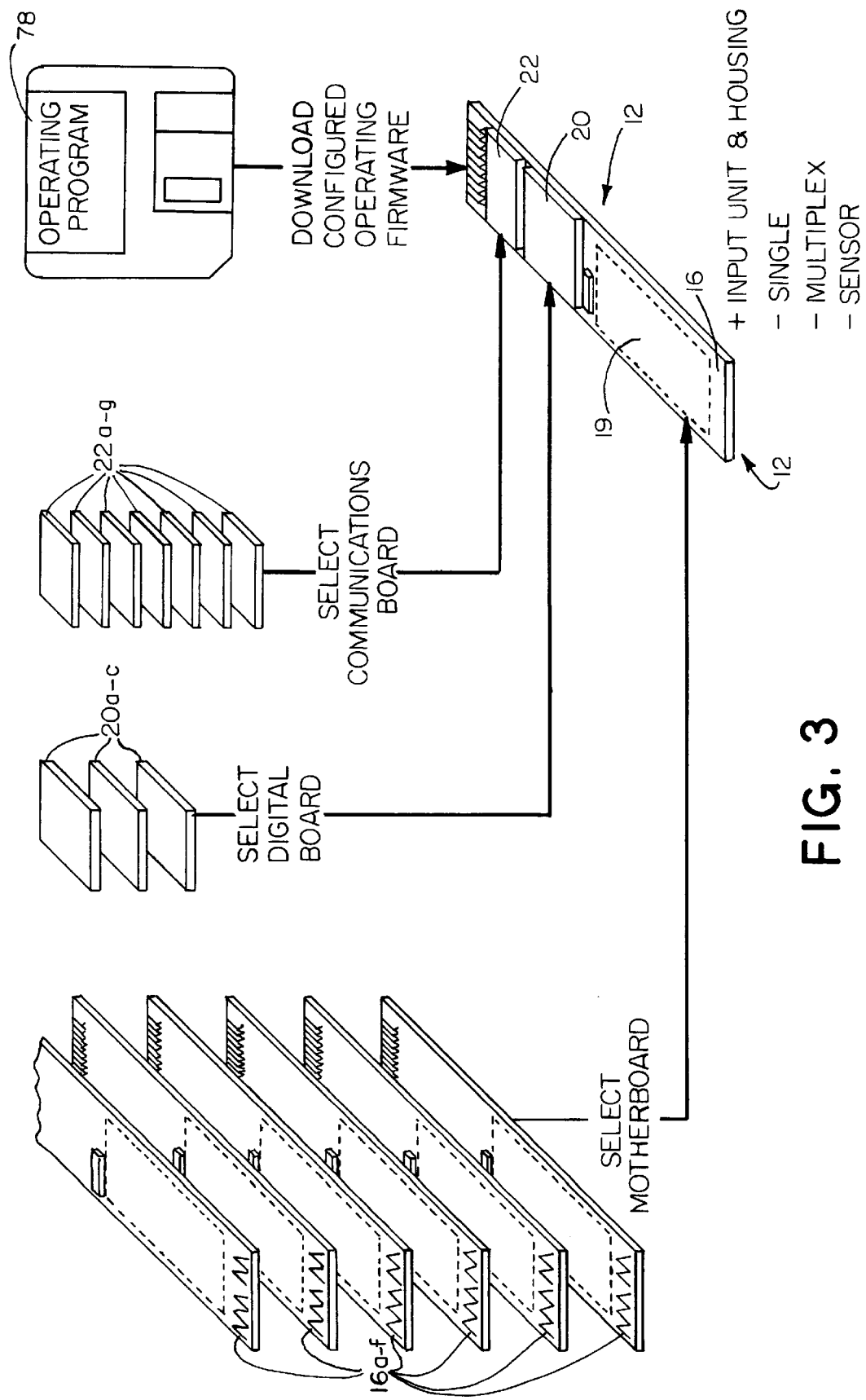
FIG. 3 is a pictorial diagram illustrating the modular capabilities of the universal measurement control and communications module.

FIG. 3 is a pictorial diagram illustrating the modularity of the universal measurement control and communications module (or body) 12. The body 12 allows a variety of motherboards 16a–16f to be selected, thereby providing a user with varying analog core portions 19. In this manner, one may use various signal conditioning circuits 17 as well as various, distinct analog-to-digital & control circuit functions 18. A user may also select one of a plurality of digital core circuit boards 20a–20c to customize their desired conversion methodologies, etc. Again, as discussed earlier, one may also select one of a plurality of communication interface circuit boards 22a–22g which provide unique communication interface protocols for communication to the outside world. Lastly, one may download various forms of operating firmware (or operating instructions) to be utilized by the various boards discussed. In this manner, a user may select a semi-custom measurement device, thereby providing custom-type performance for the user while simultaneously maintaining a lower cost structure due to the modularity. This modular design provides versatility in measurement acquisition.

Figure 4:
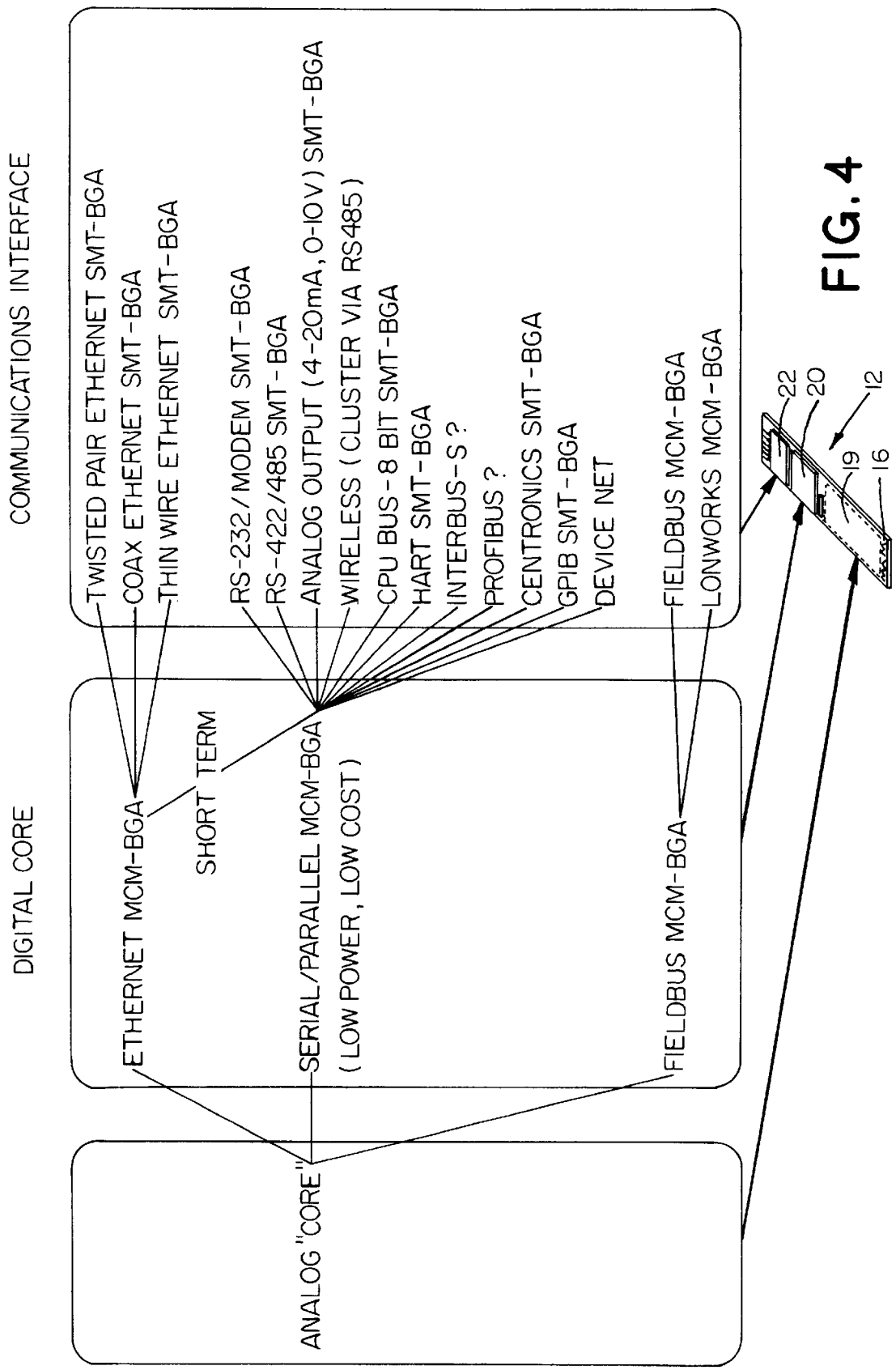
FIG. 4 is a combined pictorial diagram and table illustrating in greater detail the modularity of the universal measurement control and communications module.

FIG. 4 is a combined pictorial and table diagram illustrating again how the modularity of the universal measurement control and communications module 12 provides a user a substantial amount of versatility. Having a motherboard 16 with a particular analog core 19, one can see that by selecting one of three digital core circuits 20, and having several communication interface circuits 22 available for each digital core, a user may select a plethora of measurement configurations. This versatility allows a user to have custom-type measurement performance while maintaining a low cost measurement system since each individual module is made in volume.

Figure 5A:
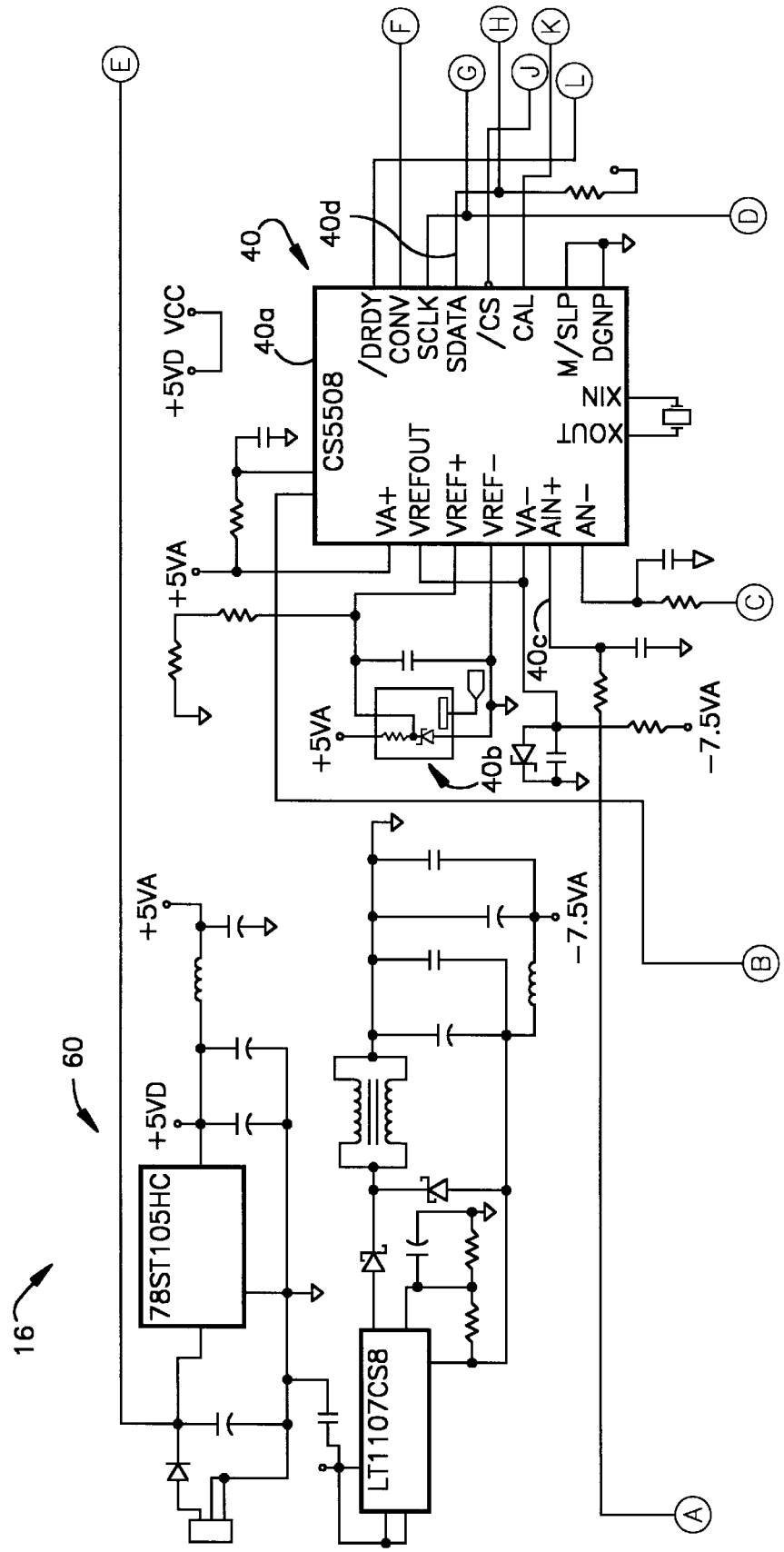
FIG. 5 is a schematic diagram illustrating the motherboard of the universal measurement control and communications module.
Figure 5B:
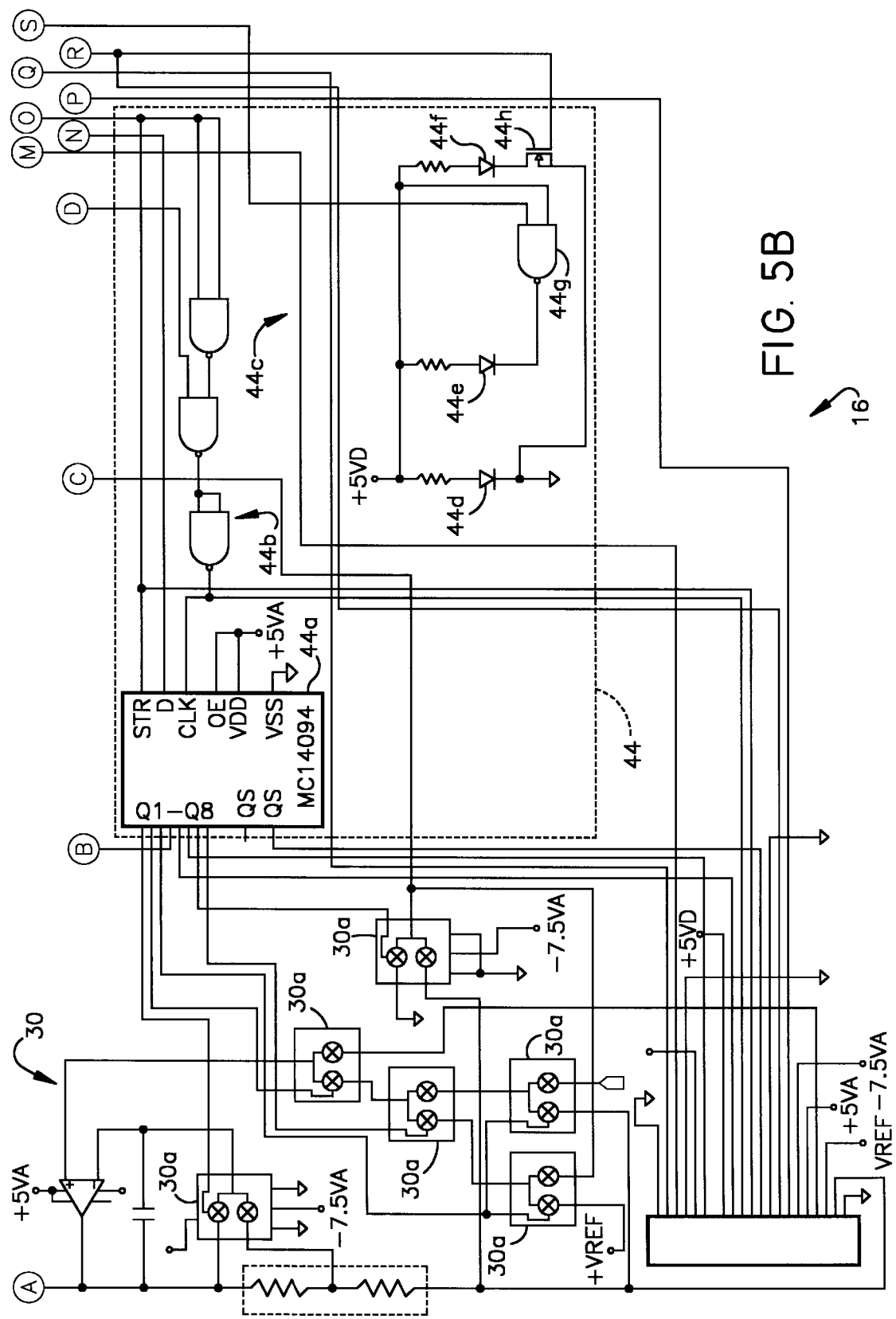
Figure 5C:
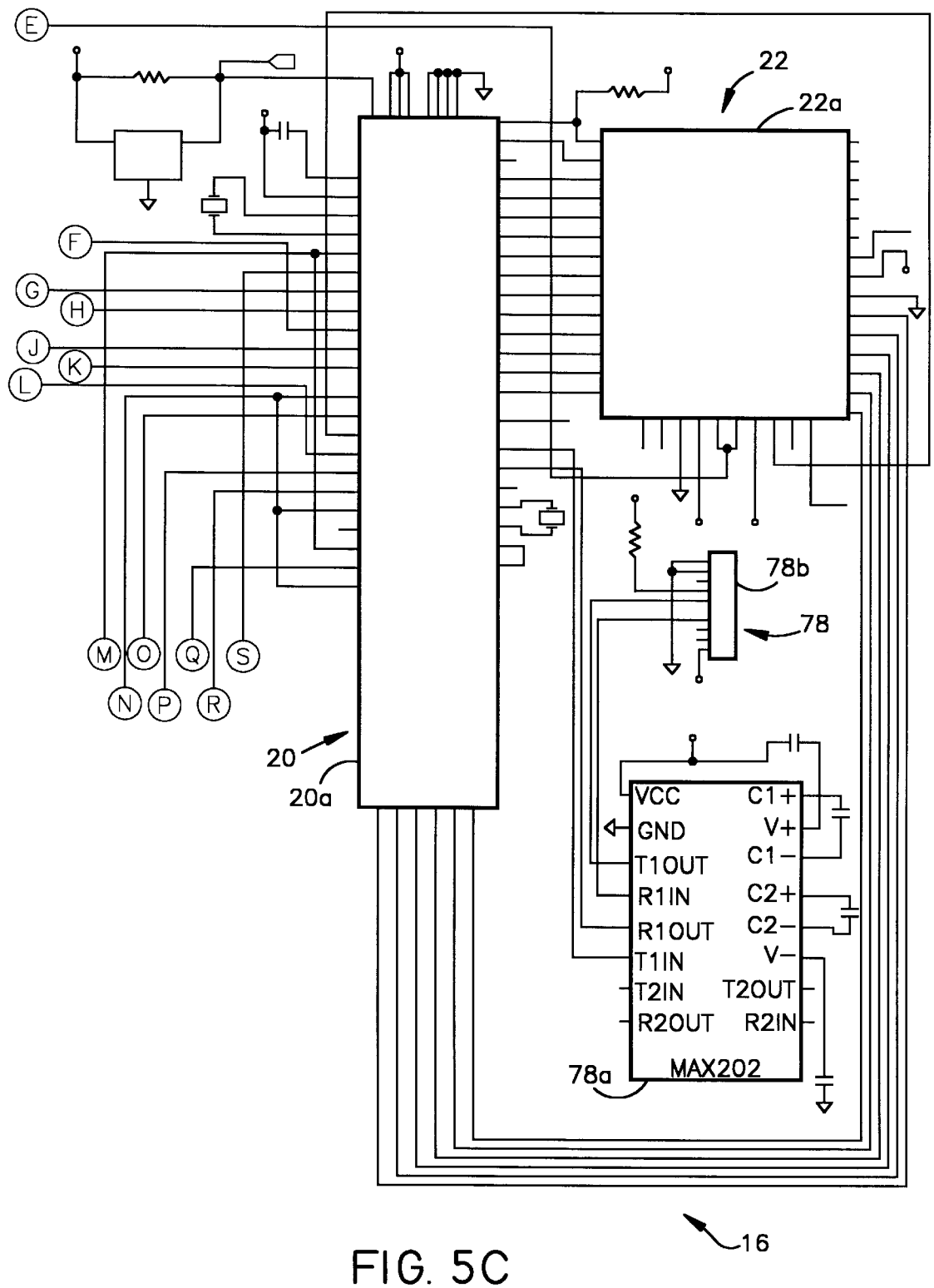

FIG. 5 is a schematic diagram which illustrates in yet greater detail the motherboard 16 layout for the universal measurement control and communications module 12. FIG. 5 illustrates the power supply portion 60 which provides suitable power for the operation of the motherboard 16 and other circuits associated with the system 10, such as the input module 14, the digital and communications core circuits, which may be on the respective daughter boards mounted in turn on the motherboard 16, etc. The motherboard 16 also includes the analog-to-digital converter 40 coupled to the analog-to-digital control circuit 44. Front end/signal conditioning circuit 30 is also resident on the motherboard 16 and is coupled to the interface circuit 50. Although the motherboard 16 illustrates the digital core circuit 20 and the communications interface circuit 22 for illustrative purposes, the motherboard 16 in reality has connectors at these locations for connection to the digital core circuit 20 and the communications interface circuit 22, the respective connectors 20a, 22a are shown on the motherboard 16 in FIG. 5. Therefore, the digital core circuit 20 is coupled to the mother-board 16 via a connector resident on the motherboard 16. In a similar manner, the communications interface circuit 22 is also coupled to the motherboard 16. An RS-232 port 78 includes an RS-232 integrated circuit 78a which converts the input data to RS-232 format, and a connector 78b to receive the data from the circuit 78a and to couple the data to an external device. The RS-232 port 78 is on the motherboard 16 and is coupled to the digital core circuit 20 to provide a local output port for a local reading of the calculated measurement. In this manner, a user could couple a portable electronic device such as a personal digital assistant to the RS-232 port 78 and thereby read the measurement taken. This provides the user flexibility by enabling the user to take and read measurements at the site locally. This also provides diagnostic type performance information to calibrate the device, check and debug downloaded firmware.

The interface circuit 50 is intended to couple with any of various input modules 14. The signal received from the input module would be preconditioned at least to some extent. The interface circuit 50 also may couple signals to the input module 14 to cause specified functions, such as to indicate which sensor is to be read; how the multiplexer is to operate; whether and/or which calibration functions are to be carried out; whether range information should be gathered, etc.

The signal conditioning circuit 30 includes a number of analog switches 30*a* which can be controlled by the microprocessor on the digital core circuit 20, which may be on a daughter board that is attached by a connector to the motherboard 16. The analog switches can be set to take the signal from the input module and to measure offset, to do some generic signal conditioning of the signal from the input module, to short one or more circuits to check for proper grounds, etc. Signals from the microprocessor sets up the analog switches of the signal conditioning circuit 30 to obtain the desired function and/or signal conditioning.

The analog-to-digital converter 40 includes a conventional analog-to-digital integrated circuit 40*a*. A voltage reference 40*b* is provided to the circuit 40*a*. The input to the analog-to-digital circuit 40*a* is provided on line 40*c*, and the digital output is provided on line 40*d*. The output on line 40*d* may be provided the microprocessor on the digital core circuit 20, and from there to the communications interface circuit 22.

The analog-to-digital control circuit 44 includes a serial communications link 44*a* integrated circuit, the output from which is coupled to the interface 50 and from there to the input module. The serial communications link 44*a* may be a shift register which is controlled by the microprocessor and by a number of gates 44*b*, and it converts serial input signals to parallel output signals.

A status indicator circuit 44*c* includes three light emitting diodes 44*d*, 44*e*, 44*f*. The LED 44*d* is coupled to across the circuit low voltage power terminals and produces a light output when power is provided to the system 10; such light output is independent of the operation of the digital core circuit 20. The LED 44*e* is coupled to receive an input from the microprocessor on the digital core circuit 20 via a gate 44*g* when diagnostics of the system 10 show proper functioning of the system 10, e.g., diagnostics have passed. The LED 44*f* is coupled via a MOSFET transistor 44*h* to the microprocessor and is operated to provide a pulsed light output or flashes of light during communications between the system 10 and the remote computer and/or during communications between the motherboard 16 and the input module 14.

The reference circuit 38 may be in effect a reset circuit, as is conventional in many electronic circuit systems. The circuit 38 may be operative during the startup of the system 10 to preclude operation of various portions of the system until the other needed portions are properly operational, such as the input voltage from the power supply 60 is at an acceptable level.

Figure 6A:
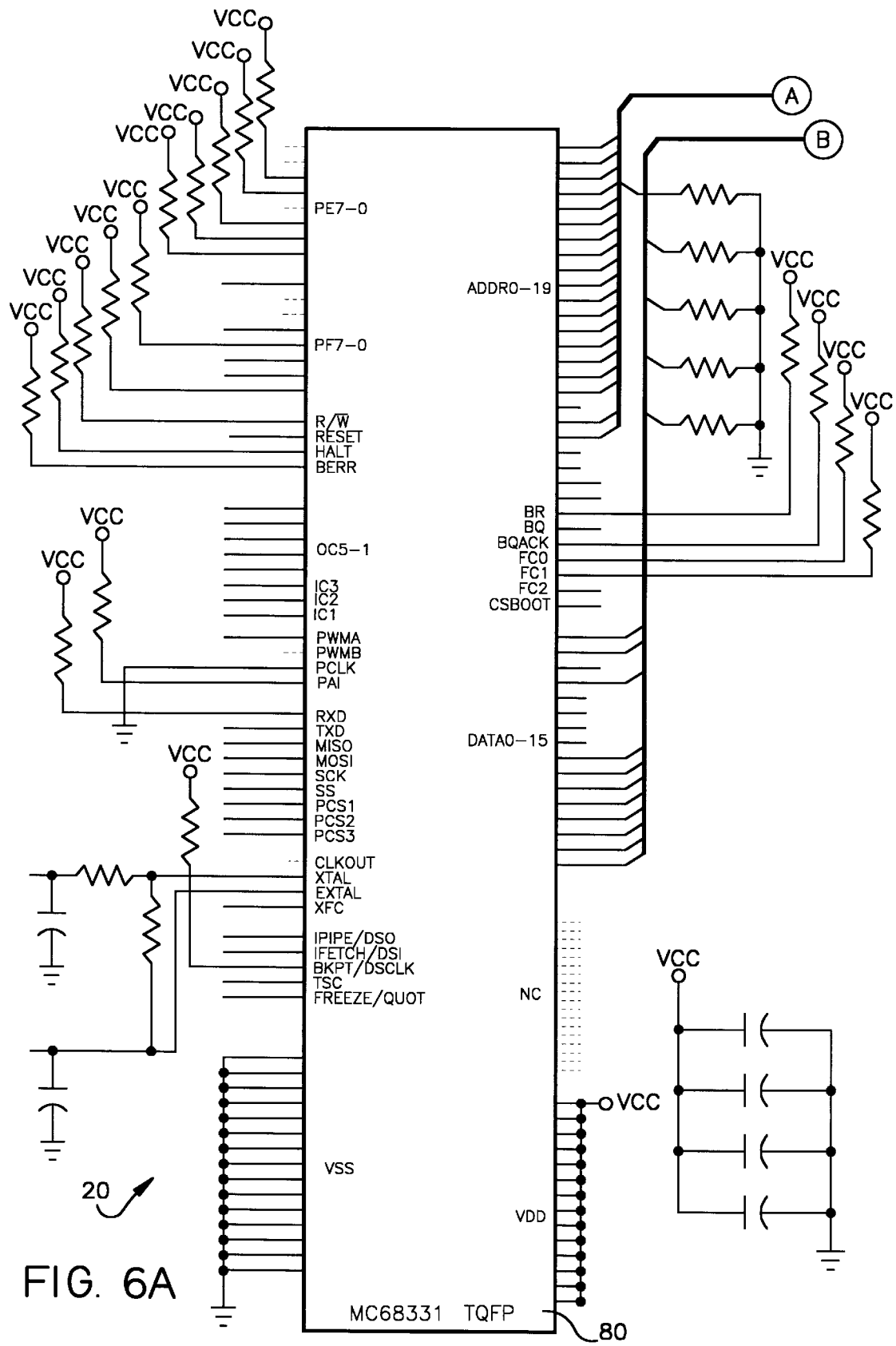
FIG. 6 is a schematic diagram illustrating a digital core circuit of the integrated modular measurement system.
Figure 6B:
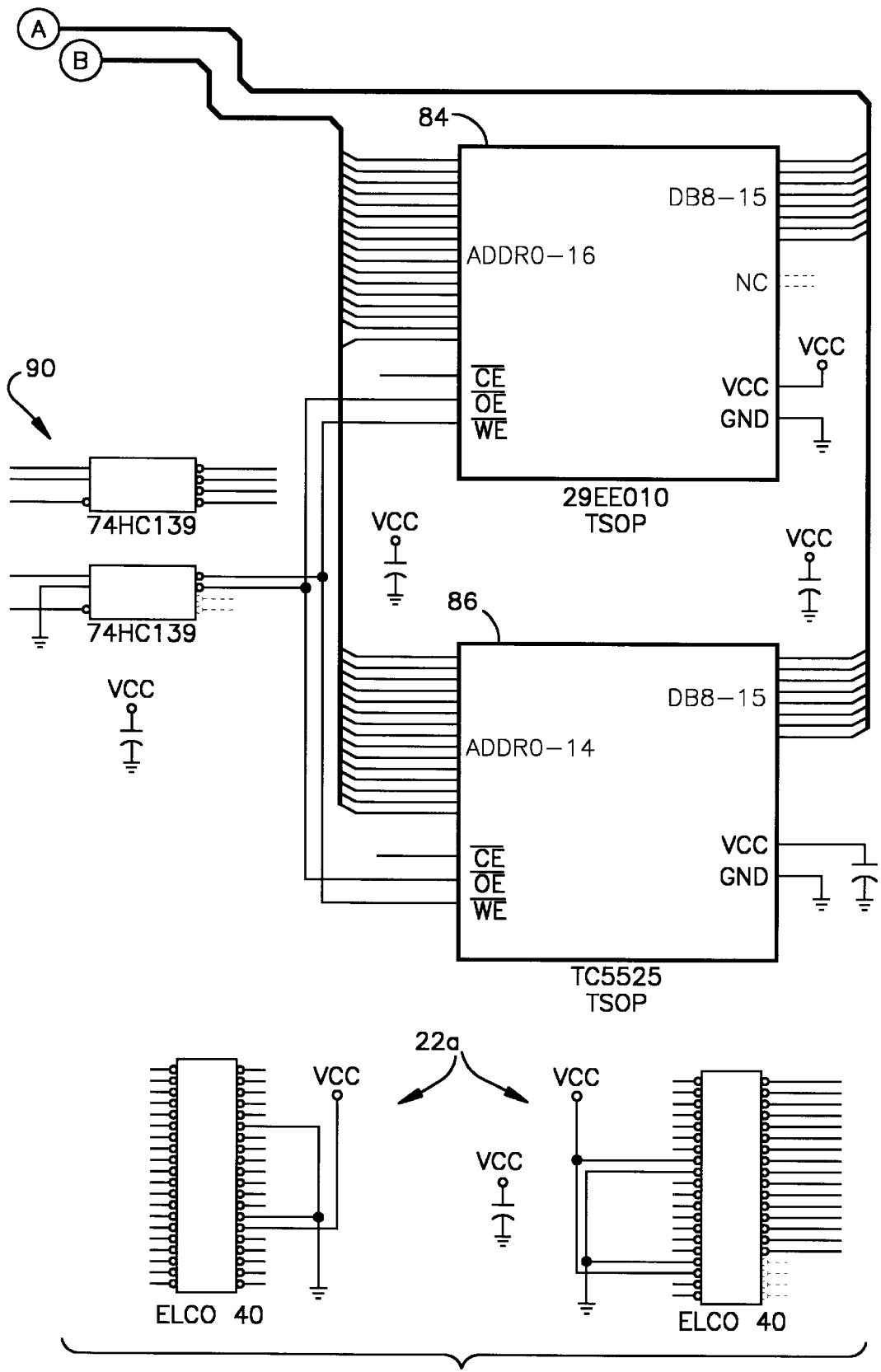

FIG. 6 is a schematic diagram of the digital core circuit 20. The digital core circuit 20 has a processor 80 (sometimes referred to herein as the microprocessor) connected to the motherboard 16 via a processor connector 20*a* shown in two parts. Various lines in the core circuit 20, such as the terminals of the processor 80, are coupled to similarly identified terminals of the connector 20*a*, as is conventional label technique. Similar label technique is used in the other drawing figures hereof. The processor 80 is also connected to a flash memory 84 which contains downloaded firmware. The processor 80 is also coupled to an SRAM 86 which is utilized as a scratch memory. A memory logic circuit 90 is coupled to the flash memory 84 and the SRAM 86 and is operable to turn the memories on and off. The processor 80 takes the digital data from the analog-to-digital converter 40 on the motherboard 16 and, using the firmware stored on the flash memory 84, converts the digitized measurement data into a value which represents the characteristic and parameter being measured.

Figure 7:
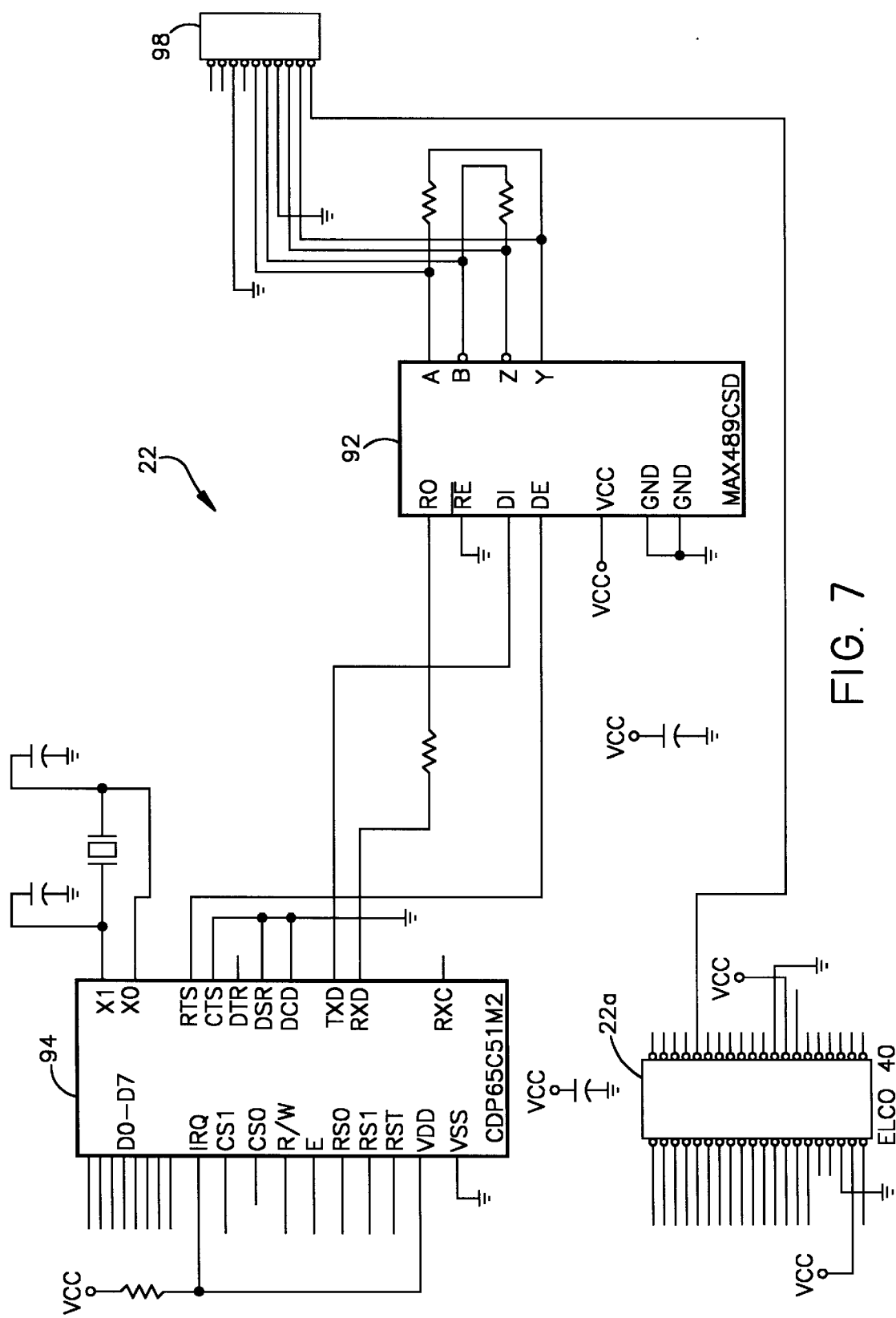
FIG. 7 is a schematic diagram illustrating a communications interface circuit of the integrated modular measurement system.

FIG. 7 is a schematic diagram which illustrates the communications interface circuit 22 in the body portion 12. Each communications interface circuit 22 includes a transceiver 92 coupled to a UART (Universal Asynchronous Receive and Transmit Device) 94. The transceiver 92 is also coupled to the motherboard 16 via connector 22*a* to communicate with the digital core circuit 20. The transceiver 92 is also coupled to a cable connector 98 which, in turn, connects to the communication connector 58 to the outside world. The transceiver 92 corresponds to particular communications protocol selected by the user. For example, the communications protocol might be through an RS-232 or an RS-422 type communications protocol. For alternative type communication interfaces, the communications interface circuit 22 utilizes a different type of transceiver 92. Operation of the transceiver 92 and UART 94 to provide data and/or other information to the cable connector 98 and the outside world, such as to a distant computer, is controlled by the processor 80. The embodiment shown in FIG. 7 is a communications interface circuit 22 for RS-422 communications protocol; appropriate circuits also may be used for RS-232, ethernet or other protocols.

Figure 8:
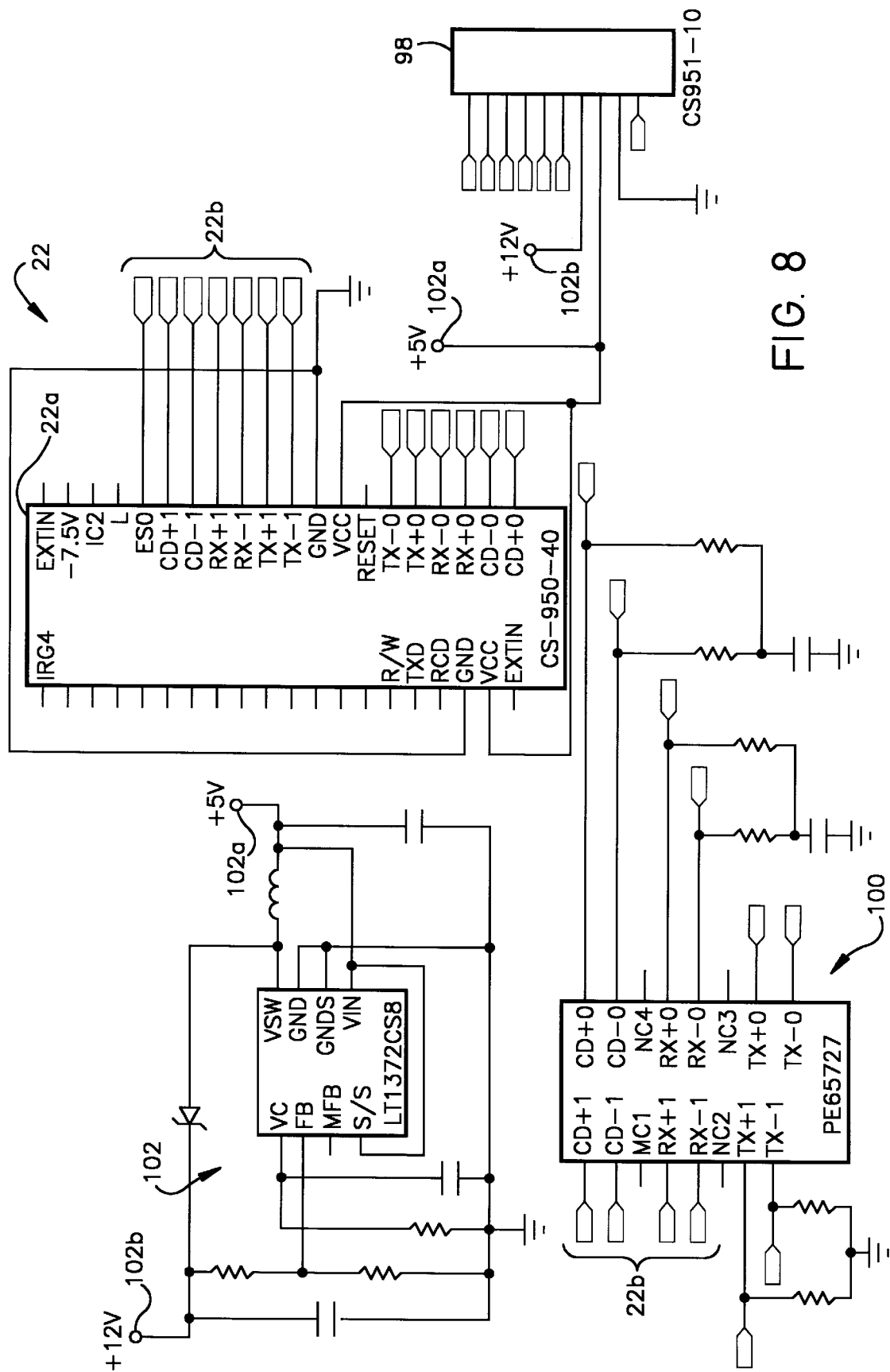
FIG. 8 is a schematic diagram illustrating an alternative communications interface circuit of the integrated modular measurement system.

FIG. 8 is a schematic diagram illustrating the communications interface circuit 22' for an ethernet type communications protocol. Because the ethernet protocol is a detailed and unique standard, it requires unique circuitry. The communications interface circuit 22' includes a transformer 100, such as a pulse transformer, which is coupled to the cable connector 98. The transformer 100 is also coupled to the motherboard connector via the connector 22*a*, respective connections being represented by the arrows 22*b*. The ethernet communications interface circuit 22' also includes a voltage converter 102, such as a 5 volts to 12 volts converter for the ethernet protocol, the 5 volt input being provided at terminal 102*a* and the 12 volt output at the terminal 102*b*. The transformer 100, which provides an isolation function, for example, and the voltage converter 102 operate to comply with the ethernet protocol specifications.

The integrated modular measurement system 10 of the invention has a housing 104 which protects the sensor and conversion circuitry. The housing 104 utilizes a plurality of tabs and snaps to secure the body portion and the input module both individually and collectively. Use of the tabs and snaps eliminates the need for additional securing means, such as screws, dowels, etc. The housing for the body 12 and that for the input module have supporting ribs which provide structural rigidity to the enclosures respectively and also secure internal circuitry vertically and/or laterally. A key between the input module and the body portion housing assures the proper lateral relationship between the two parts, thereby improving system reliability and protective security of the parts of the system.

Figure 9A:
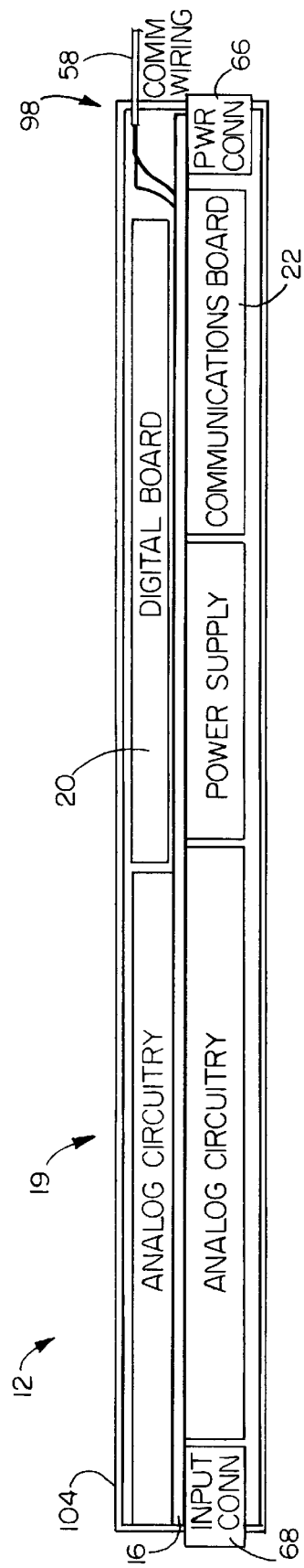
FIGS. 9A and 9B are side and end cross-sections illustrating a housing which contains the universally measurement control and communication module of the integrated modular measurement system.
Figure 9B:
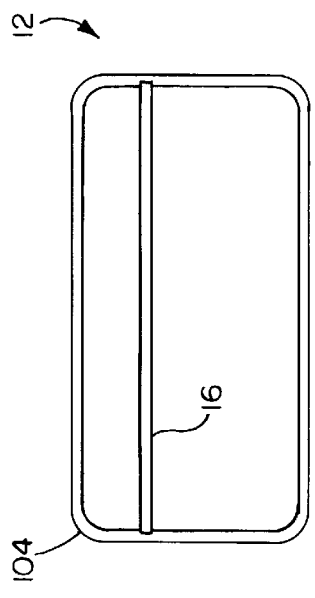

FIGS. 9A and 9B are side and end cross-sectional diagram illustrating a housing 104 containing the motherboard 16 as well as its associated components that comprise the body portion 12. The housing 104 has the motherboard 16 disposed laterally within its cross-section. The motherboard 16 is double-sided and has the analog core portion 19 at one end with the digital core circuit 20 at the opposite end on one side of the motherboard 16. On that same end, on the opposite side of the motherboard 16, is located the communications interface circuit 22 and the power connector 66 is located beside the communications interface circuit 22. A communications wiring harness 58 is coupled to the communications interface circuit 22 and exits the housing 104 via connector 98 to make contact with the outside world. The communications wiring harness 58 communicates via the appropriate communications protocol dictated by the communications interface circuit 22, 22' to the circuits or components to which it is coupled. The input connector 68 couples to the motherboard 16 on the end opposite the power connector 66. The input connector 68 is a component of the input module 14 and couples the measurement data from the sensors 28, for example, for measuring various application characteristics. FIG. 9 illustrates the manner in which the analog core portion 19, the digital core circuit 20, and the communications interface circuit 22 may be packaged on the motherboard 16 thereby providing a small form factor body portion 12 within the housing 104. The motherboard 16 may also utilize surface mount packages for the analog core 19, digital core circuit 20 and the communications interface circuit 22 to thereby further decrease the form factor of the housing 104. The small form factor housing 104 has the digital core circuit 20 which performs the measurement data conversions to be local to the site of measurement acquisition. This feature eliminates line losses associated with prior art systems that collected measurement data locally and subsequently transmitted the measurement data to a remote location for processing. In the integrated modular measurement system 10, preferably only digital information is transferred remotely via the communications connector 58, wherein line losses are generally not relevant. This feature further improves the accuracy of the measurement system 10.

FIG. 10 is a pictorial diagram illustrating a plurality of body portions 12, wherein each of the body portions has a unique input module 14a–14e coupled to the body 12. As was described in conjunction with the FIGS. 1 and 2, the integrated modular measurement system 10 may operate with any of a plurality of distinct sensors 28. Additionally, the body portion 12 is capable of coupling with any of various unique input modules 14a–14e. Not only are the sensors 28 unique, but the type of input module 14 utilized is distinct. FIG. 10 illustrates an input module 14a having a single input, an input module 14b having a sensor head input, an input module 14c having a multiplexed input, and input module 14d having a probe type input, and an input module 14e having a fiber optic sensor type input. Each of these unique input modules 14a–e are coupled to the body portion 12 via the input connector 68. The sensors 28 may be internal of the input unit 14, e.g., as at 14b, or they may be external, e.g., as at 14d. The input connector 68 is illustrated on the outside of the input body portion 12 in FIG. 10, however, the input connector 68 could also be located internal to the cross-section of the body portion 12 and input module 14 and therefore would not be visible in the view illustrated in FIG. 10. The input modules 14a–14e may each operate in conjunction with the body portion 12 because the input module 14 has a multiplexer 26 which is operable to selectively transmit one of a plurality of sensor input signals to the body portion 12. Further, the input modules 14a–14e have an input shift register 72 and an output shift register 74 which will accommodate data associated not only with the type of sensor 28 being implemented, but also the type of input module 14 being utilized. The input shift register 72 and the output shift register 74 communicate with the analog-to-digital control circuit 44 of the body portion 12 to indicate the type sensor 28 and the format in which the input module 14a–14e will be utilized. This function is illustrated in FIG. 10, provides a user even greater versatility in making various measurements.

Figure 11:
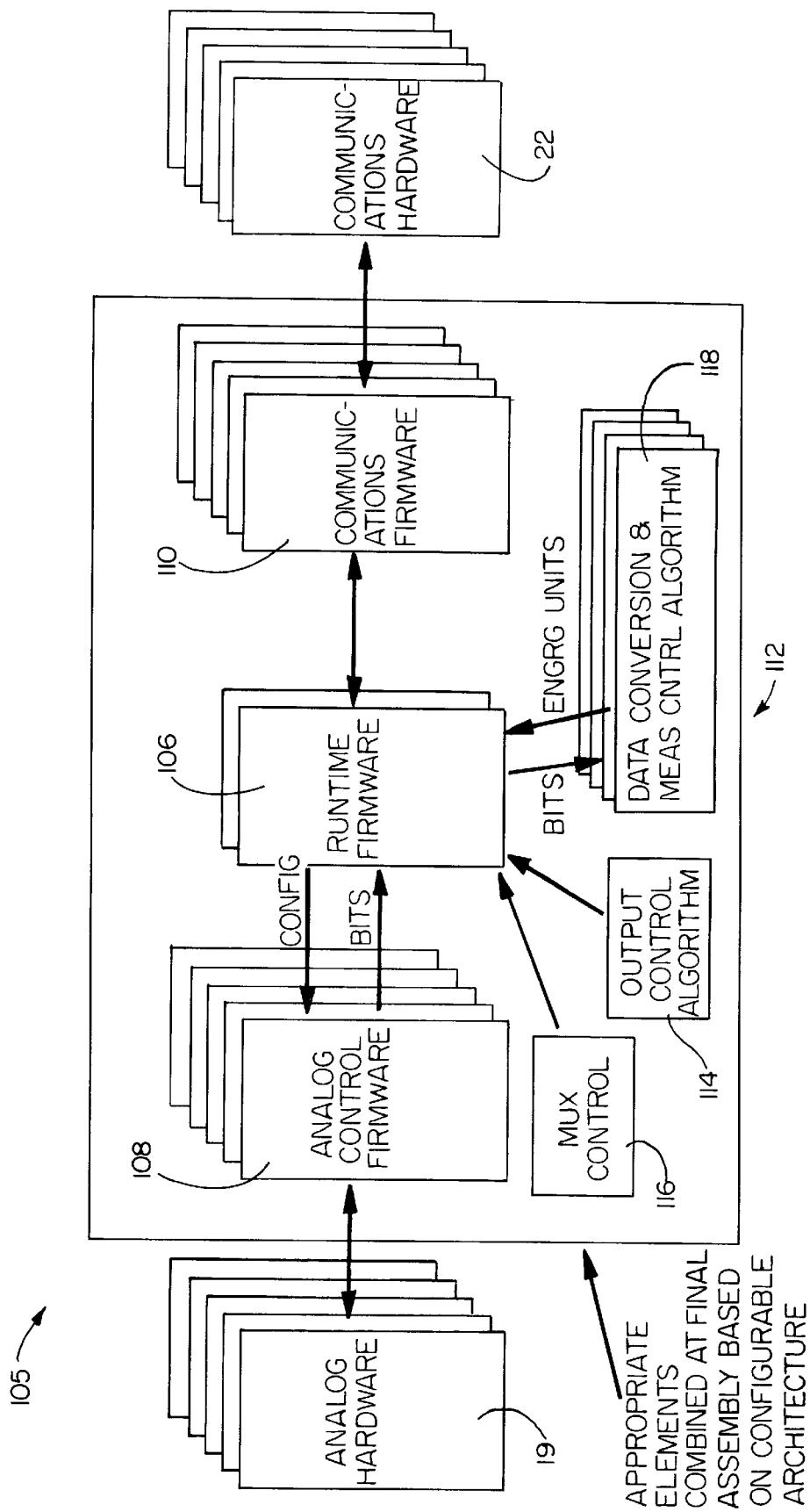
FIG. 11 is a block diagram illustrating a configurable firmware architecture.

FIG. 11 is block diagram illustrating the configurable firmware architecture 105. The architecture includes a runtime firmware portion 106 operable to communicate with an analog control firmware portion 108 and a digital communications firmware portion 110. The runtime firmware 106 is also operable to communicate with output control algorithms 114, multiplexing control instructions 116 and data conversion and measurement control algorithms 118 which comprise the digital core firmware portion 112. The configurable firmware architecture 105 is configurable to the extent that the analog control firmware 108 may be selected from a plurality of unique analog control instructions. A user may select one of the plurality of instructions which will then be downloaded, e.g., into the flash memory 84, as the analog control firmware 108 and will operate in conjunction with the analog core portion 19. In a similar manner, the communications firmware 110 may also be selected from a plurality of different firmware instruction sets. A user, by selecting the desired functionality, will then have the appropriate firmware instructions set downloaded into the respective memories on the body portion 12 for communications instructions for the communications interface circuit 22. In a like manner, the digital core firmware 112 is also configurable and may be selected by a user. Therefore, a user has great flexibility in identifying not only the hardware components desired, but also the manner in which those hardware components will interact with one another by selecting the configurable firmware architecture 105. The configurable firmware architecture 105 may also be subsequently modified or upgraded as illustrated in FIG. 12.

Figure 12:
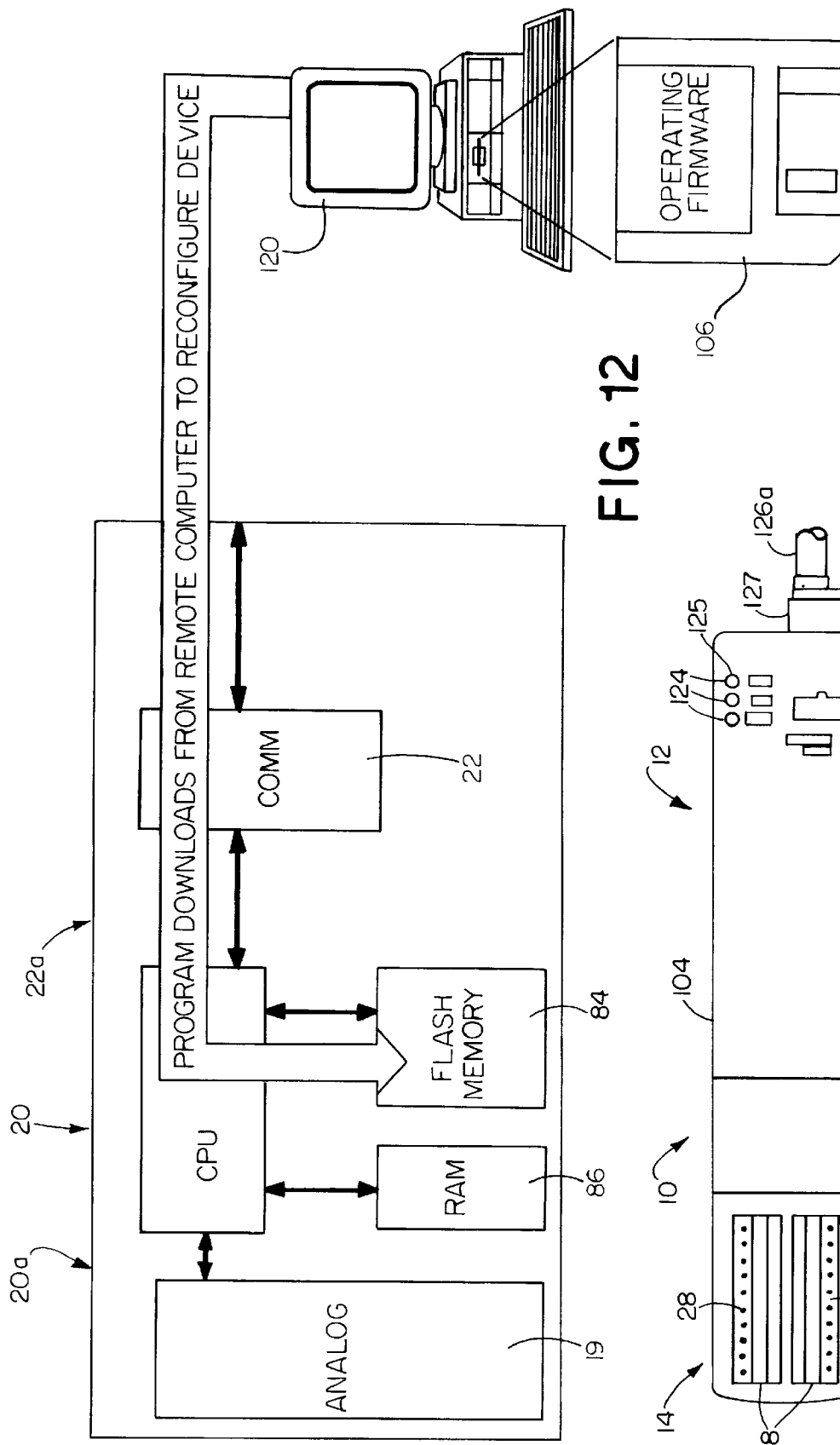
FIG. 12 is a combined block diagram and pictorial diagram illustrating a manner in which the configurable firmware architecture may be upgraded.

FIG. 12 is a combined pictorial and block diagram illustrating the manner in which the firmware resident on the digital core circuit 20 of the body portion 12 is modified. As described in conjunction with FIG. 6, the chosen firmware architecture is ultimately downloaded into the flash memory 84 of the digital core circuit 20. Via the memory connector 22a, a remote computer 120 may be coupled to the digital core circuit 20 and may download or reconfigure the firmware architecture 105 as required by user. This further provides versatility to a user in that if their needs change over time, one does not need to discard the present integrated modular measurement system 10, but rather simply needs to modify or download new firmware into the flash memory 84. This provides benefits to the user by allowing them to use fewer devices, thereby lowering their inventory and cost. This also improves a customer's maintenance scheduling and costs by having fewer units to maintain. The configurable firmware architecture 105 also allows the existing hardware to be reconfigured for new tasks that were not previously anticipated or appreciated. This eliminates the need to purchase new hardware. The configurable firmware architecture 105, therefore provides a near virtual measurement hardware system by allowing multiple type measurement systems to be utilized within a single apparatus. Software upgrades and reconfigurations via downloading of new or modified firmware are relatively easy and inexpensive.

Figure 13:
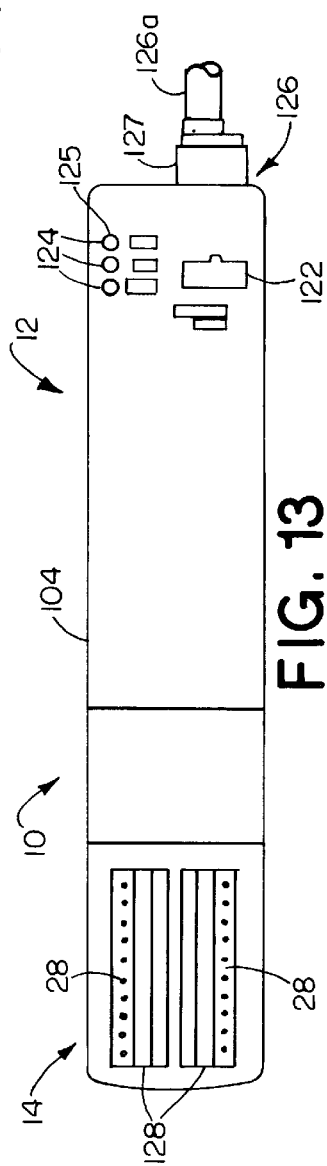
FIG. 13 is a pictorial diagram illustrating the integrated modular measurement system.

FIG. 13 is a pictorial diagram illustrating the integrated modular measurement system 10. The system 10 has the universal measurement control and communications module (the body) 12 connected to the input module 14. The body 12 has an outside housing 104 that encases the analog portion 19, the digital core circuit 20 and the communications interface circuit 22 of the body 12. The housing 104 has a receptacle 122 forming a local port. The local port 122 provides access to the RS-232 port 78 on the motherboard 16 and allows one to read a measurement from the body 12 locally by coupling a portable computer or personal digital assistant to the system 10. This feature provides a user immediate information regarding the measurement as well as providing for calibration or diagnostic tests to be run on both hardware and firmware. A plurality of status LEDs 44d, e, f, also are displayed through holes 125 in the housing 104 and provide status information to a user such as whether a measurement is being taken, whether signal conversion and measurement calculation has taken place, whether an error has been experienced, or other information. A single LED light may be displayed or a sequence of LED lights may turn on to provide a variety of different status messages to a user. The housing 104 also has a strain relief 126 which allows a communication cord 126a to be adequately and securely coupled to the cable connector 98. The strain relief 126 securely grips a cord (or communications connector 58) to relieve any strain that external pressures placed on the cord may have upon the connection to the cable connector 98 on the communications interface circuit 22. A nut 127 is threaded over the strain relief 126, thereby adding additional pressure to the communications connector 58 to secure it in place.

The input module 14 of the integrated modular measurement system 10 has two openings 128 to allow access to the multiplexed input sensor 28. A user may take a plurality of measurements with the input module 14 by coupling the device being measured to at least one of ports in the multiplexed input sensor 28 (whether of the internal or external types 28a, 28b). As described above in conjunction with FIGS. 1–12, the electrical signal is then conditioned, digitized and converted to a value representative of the characteristic or parameter being measured. This value is then communicated using the appropriate communications protocol to the user either locally via the local port 122 or remotely via the cable connector 98 and corresponding communications connector 58 and cable 126a.

FIG. 14 is a top view of the housing 104 of the body portion 12 of the integrated modular measurement system 10. The housing 104 has a housing top portion 104T with a circular collar 132 at one end. In this particular embodiment the collar 132 is circular; alternatively, however, the collar 132 could octagonal, square or any shape that is operable to receive an electrical cord. The collar 132 has a crimped portion 134 at its end. The crimped portion 134 is generally flexible to effectuate the strain relief 126 of FIG. 13. Within housing 104 is a cavity 136 in which the analog core portion 19, the digital core circuit 20 and the communications interface circuit 22, all of which may be mounted on the motherboard 16, reside. The housing 104 protects this internal circuitry against rough handling as is common with industrial or commercial measurement devices. The housing 104 has body snaps 138 at its module end 139 which mates with the input module 14, thereby precluding use of extra fastening parts such as screws, etc. The body snaps 138 extend down generally parallel to side walls 146 of the housing top 104T toward a bottom portion 104B (not shown in this figure) of the housing 104 and mate with a retention surface in the bottom portion 104B, thereby holding the housing top 104T and the bottom portion 104B securely together. A guide 148 in each side wall 149 of the bottom housing portion 104B cooperates with side walls 146 of the top housing part 104T to guide the two housing parts together. The input module end 139 of housing 104 also contains a snap 140 which connects with the input module 14, thereby holding the input module 14 in close proximity to the housing 104 to allow the electrical signal to be transferred to the body portion 12. The snap 140 also eliminates extra fastening parts. The housing 104 also has a plurality of support ribs 142 that provide structural support and rigidity to the housing 104. The ribs 142 also aid in positionally situating the motherboard 16 vertically within the housing 104, thereby securing the motherboard 16 within the housing 104. The housing top 130 also has the status LEID holes 125 as described in conjunction with FIG. 13. A port or opening 143 in the end 144 of the housing 104 provides access for a power cord to supply electrical power to the system 110 from an external power source.

FIGS. 15a–15c illustrate a partial cross-section of the housing 104 taken along lines A—A, B—B, and C—C of FIG. 14 respectively. FIG. 15a illustrates the collar 132 which allows passage of the communications connector 58 and/or cable 126a into the cavity 136 for connection to the cable connector 98 on the communications interface circuit 22. FIG. 15b illustrates the body snaps 138 that extend into the bottom portion 104B of the housing 104 to secure the top portion 104T and the bottom portion 104B of the housing 104 together. FIG. 15c illustrates the collar 132 in a manner similar to FIG. 15a.

FIG. 16 is a top side view of the top portion 104T of the housing 104. The housing top 104T has the plurality of LED status holes 125, part of the collar 132, the crimped portion 134 of the strain relief, the body snaps 138, and a lateral view of the snap 140, which is seen in sectional side elevation. The snaps 138, 140 are for connection to the input module 14.

FIG. 17 is a bottom side view of the bottom portion 104B of the housing 104. The housing bottom portion 104B is shown with the plurality of supporting ribs 142 on its sides. The ribs 142 have different heights (142a and 142b) to provide locational guidance for the motherboard 16 within the housing 104. The motherboard 16 lies inside the bottom portion 104B with its sides laying on top of the short ribs 142a. The top portion 104T subsequently is brought down to mate with the bottom portion 104B. The ribs (not shown) within the top portion 104T also make contact with the motherboard 16 and hold the motherboard 16 secure within its vertical dimension. The taller ribs 142b may optionally serve to hold the motherboard 16 securely in a lateral direction if desired.

FIG. 18 is a fragmentary back view of the housing 104 where the strain relief 126 is located. FIG. 18 shows the top portion 104I, the side walls 146 and fhe bottom portion 104B. The crimped portion 134 is visible as well as the outside portion of the collar 132. Also, the opening 143 in the wall 144 for the power cord is shown.

FIG. 19 is an enlarged view of one half of the strain relief 126 on one housing part 104T or 104B; the other half would be on the other housing part to complete a generally hollow cylindrical or truncated conical shape. The crimped portion 134 consists of a plurality of flexible teeth 150 arranged in an approximately circular pattern. The flexible teeth 150 make physical contact with the communications connector 58 or cable 126a running through it. The flexible nature of the teeth 150 force the teeth 150 into a secure contact with the connector 58. The subsequent application of a nut 128 over threads (not shown) located on the collar 132 apply additional force on the connector 58, thereby securing the connector 58 within the collar 132. In this manner, the strain relief 126 relieves stresses that could be placed upon the cable connector 98 within the body portion 12 and thereby assures a proper electrical connection.

FIG. 20 illustrates the input module 14 in which the sensor(s) 28 are located. The input module 14 has a top wall 152, a front wall 153, and a bottom wall 154. A cut-away portion 156 exists within the input module 14 to provide space for the sensor 28 and additional circuitry, as illustrated and described in conjunction with FIGS. 1 and 2. About an edge of the cut-away portion 156 is a lip 157 which provides guidance and securing means for the subsequent placement of a cover over the cut-away portion 156. A plurality of support ribs 158 are located along the side of the bottom wall 154 of the input module 14. The top wall 152 of the input module 14 has snaps 160 that mate with the housing 104 of the body portion 12 to provide for a secure connection when coupling the body portion 12 and the input module 14 together. The input module 12 also has a key 162 on the top wall 152 and the bottom wall 154 to provide mating guidance between the body portion 12 and the input module 14. When the keys 162 line up with a corresponding notch (not shown) within the housing 104 of the body portion 12, the input module 14 and body 12 are in proper lateral relationship and assure appropriate mechanical and electrical connection.

FIG. 21 illustrates a bottom view of the input module bottom wall 154 which highlights the key 162 for assuring the proper lateral positions of the input module 14 and the body portion 12 with respect to one another. Likewise, FIG. 22 is a top view illustrating the input module top wall 152 and the cut-away portion 156.

In FIG. 22 is seen a locking step or ridge 163 onto which the snap 140 (FIG. 14) can lock. An end 140a of the snap 140 is raised, is supported from a resilient snap arm 140b, is urged over the edge 163, and retains the input module 14 to the body 12. Openings 163a adjacent respective ridges 163 in the top and bottom walls of the input module provide access to insert a pointed or thin rigid tool into engagement with the respective resilient snap arms 140b to release the locking mechanism formed by the snap tabs 140 and the ridges 163 allowing the body 12 and the input module 14 to be separated.

FIG. 23 is a front view showing the front wall 153 of the input module 14. This front view illustrates support ribs 158 along the sides as well as the keys 162 on the top wall 152 and the bottom wall 154. A tab receptacle 164 is on the front portion 153 to receive a tab (not yet shown on a cover). The tab receptacle 164 aids in securing a cover over the cut-away portion 156.

FIGS. 24–26 are partial cross-sections taken along dotted lines A—A, B—B and C—C of FIG. 22. FIGS. 24–26 illustrate, in different views, the front portion 153, the bottom portion 154, the lip 157 and the support ribs 158, and the tab receptacle 164.

FIG. 27 is a top view illustrating a cover 166 for covering the cut-away portion 156. The cover 166 has no holes in it, but rather may be machined to provide custom apertures to access the sensor 28 located within the input module 14. The cover 166 may be configured differently to mount a probe or otherwise to support, to connect to or to provide access to one or more sensors. The cover 166 also has a tab 168 couple to the top wall 152 of the input module for securing the cover 166 to the top wall 152. The cover 166 has a front cover snap 170 which engages the tab receptacle 164 illustrated in FIG. 23 to rigidly secure the cover 166 to the front wall 153 of the input module 14. The tabs and snaps eliminate the need for additional parts such as screws, etc., thereby making construction simple and inexpensive. Preferably the arrangement of tabs and snaps of the input module parts prevents opening or removing the cover 166 without damaging the cover or other parts of the input module. This helps dissuade a user from gaining access to the sensors and/or the circuitry in the input module, and, therefore, prevents altering the sensors such that the calibration constants in the memory 77 no longer would be valid.

FIG. 28 is a cross-section of the cover 166 taken along dotted line A—A of FIG. 27. The cross-section illustrates the tab 168 which engages the top wall 152 and the front cover snap 170 which engages the front wall 153 of the input module 14. The cross-section also shows stability posts 172 that engage the sensor 28 and associated circuitry within the input module to secure the internal pieces positionally.

FIG. 29 is a top view of another embodiment of cover 166' having two holes 174 for providing accessing to a multiplexed input sensor 28.

Although several embodiments of the invention have been disclosed for illustrative purposes, those skilled in the art will appreciate that various modifications, additions and substitutions are possible, without departing from the scope and spirit of the invention.

Summarizing, several, but not all, aspects of the invention include, for example, An integrated modular measurement system, comprising:

a universal measurement control and communications module operable to receive measurement data from a plurality of measurement sensors, and operable to convert the measurement data into a value that represents a characteristic being measured and communicate the value to a user in a plurality of signal formats; and an input module coupled to the universal measurement control and communications module, wherein the input module is operable to house one of the plurality of measurements sensors;

wherein universal measurement control and communications module facilitates versatile measurement acquisition.

A configurable measurement control and communications module, comprising:

a motherboard having interface and control circuitry for communication with a plurality of measurement sensors;

a digital core circuit connected to the motherboard for converting measurement data from each of the plurality of measurement sensor into a value that represents a characteristic being measured; and a communication circuit connected to the motherboard for communicating the data from the digital core circuit in a preselected signal format.

A custom calibrated sensor module, comprising:

a sensor; and a memory connected to the sensor, when the memory contains calibration information uniquely associated with the sensor, and wherein the calibration information is derived from calibration of the sensor.

A method of interfacing universal measurement circuitry to a plurality of measurement sensors, comprising the steps of:

coupling one of the measurement sensors to the conversion circuitry;

accessing an electronic signature of the one of the measurement sensors, wherein the electronic signatures identifies a type of measurement sensor;

configuring the conversion circuitry to interface with the measurement sensor type; and communicating data from the one of the measurement sensors to the conversion circuitry for conversion of the data into a value which represents a characteristic being measured.

A measurement system having local conversion and display capability, comprising:

a sensor attached to a handheld fixture; and a conversion circuit coupled to the sensor, wherein the conversion circuit is also attached to the handheld fixture, thereby providing conversion of an electrical signal to measurement value at a site local to the measurement and eliminating line loss associated with the remote conversion.

What is claimed is:

1. An integrated modular measurement system, comprising:

a universal module operable to receive measurement data from a plurality of measurement sensors, to convert the measurement data from an identified sensor into a value that represents a characteristic being measured and to communicate the value to a user in a plurality of signal formats; and an input module coupled to the universal module, wherein the input module is operable to accommodate the plurality of measurement sensors, wherein the universal module facilitates the versatile measurement acquisition.

2. The measurement system of claim 1, wherein the universal module comprises a motherboard having a plurality of sockets capable of receiving various types of analog core circuits, digital core circuits and communication interface circuits.

3. The measurement system of claim 1, wherein the universal module comprises a configurable analog core portion operable to perform signal conditioning of measurement data and analog-to-digital signal conversion.

4. The measurement system of claim 3, wherein the analog core portion comprises:

a signal conditioning circuit operable to perform one or more of measurement data auto-ranging, voltage transient protection or noise filtering; and an analog-to-digital converter coupled to the signal conditioning circuit operable to convert analog measurement data into a digital signal.

5. The measurement system of claim 4, wherein the analog-to-digital converter is coupled to the input module and provides an indication to the input module that measurement data has been received, and wherein the analog-to-digital converter receives a sensor type signature signal which identifies the type of sensor that collected the measurement data.

6. The measurement system of claim 4, wherein the analog-to-digital converter comprises:

a control circuit coupled to the signal conditioning circuit, operable to monitor a status of the signal conditioning circuit and initiate conversion of analog measurement data to a digital signal when signal conditioning is complete; and analog-to-digital conversion circuitry coupled to the control circuit and the signal conditioning circuit, operable to convert measurement data when prompted by the control circuit.

7. The measurement system of claim 6, further comprising a sample and hold circuit coupled between the signal conditioning circuit and the analog-to-digital conversion circuitry and coupled to the control circuit, wherein the sample and hold circuit is operable to lock the analog measurement data from the signal conditioning circuit and prevent subsequent voltage fluctuations from interfering with the measurement data, thereby insuring accuracy in the conversion of the measurement data to the digital signal.

8. The measurement system of claim 6, further comprising a multiplexer coupled between the signal conditioning circuit and the analog-to-digital conversion circuitry, wherein the multiplexer is operable to selectively couple the measurement data or a reference signal to the analog-to-digital conversion circuitry to provide calibration information for the analog-to-digital conversion circuitry.

9. The measurement system of claim 6, further comprising a memory coupled to the analog-to-digital conversion circuitry for storing the digital signal out from the analog-to-digital conversion circuitry.

10. The measurement system of claim 6, wherein the control circuit is further operable to provide indication to the input module when conversion of the measurement data into a digital signal in complete.

11. The measurement system of claim 6, further comprising a digital-to-analog conversion circuit coupled between the control circuit and the input module, wherein the digital-to-analog conversion circuit converts the digital signal back into analog measurement data for comparison by the input module with the original measurement data for automatic calibration indication functionality.

12. The measurement system of claim 6, wherein the control circuit is operable to receive one or more signals from the input module that indicate a type of sensor being used.

13. The measurement system of claim 6, wherein the control circuit is operable to receive one or more signals from the input module that represent custom calibration data for a particular sensor associated with the measurement data.

14. The measurement system of claim 4, further comprising a processor coupled to the analog-to-digital converter, operable to receive the digital signal and transfer it to a digital core portion.

15. The measurement system of claim 1, wherein the universal module comprises a configurable digital core portion, operable to receive a digital signal representative of the measurement data and convert it to parametric data representing the measured characteristic.

16. The measurement system of claim 15, wherein the digital signal is further representative of a type of sensor used to obtain the measurement data and unique calibration data associated with the sensor.

17. The measurement system of claim 15, wherein the digital core portion further comprises firmware in a memory, wherein the firmware provides one or more of conversion and signal conditioning instructions to convert the digital signal into parametric data.

18. The measurement system of claim 17, wherein the firmware is configurable, thereby allowing modification or upgrading of conversion or signal conditioning instructions to accommodate variations or changes in sensor type or sensor precision.

19. The measurement system of claim 15, further comprising a debug display portion coupled to the digital core portion, wherein the debug display provides a user a diagnostic display to debug or modify the digital core portion.

20. The measurement system of claim 1, wherein the universal module comprises a configurable communications interface portion, operable to receive parametric data representative of the measurement data and communicate it to a user through a plurality of communication protocols.

21. The measurement system of claim 20, wherein the communications interface portion comprises:
a transceiver for receiving and transmitting data; and
a transceiver control circuit coupled to the transceiver, wherein the transceiver receives the parametric data and transmits it to a user in a particular communication protocol based on a status of the transceiver control circuit.

22. The measurement system of claim 20, wherein the plurality of communication protocols are selected from the group consisting of ethernet, RS-232, RS-422, RS-485 and parallel port communication.

23. The measurement system of claim 1, wherein the input module comprises a control circuit coupled to the one or more sensors for providing a control signal to initiate measurement data acquisition and for identifying a sensor signature data from the one or more sensors to thereby identify a sensor type.

24. The measurement system of claim 23, wherein the control circuit is further operable to communicate with the universal module to thereby synchronize transfer of the measurement data and the associated sensor signature data to the universal module.

25. The measurement system of claim 23, wherein the control circuit is further operable to receive calibration data associated with the one or more sensors and transfer the calibration data to the universal module for subsequent use in converting the measurement data to the value of the characteristic being measured.

26. The measurement system of claim 23, wherein the control circuit is further operable to perform signal conditioning on the measurement data.

27. The measurement system of claim 23, further comprising a multiplexer coupled to the plurality of sensors thereby allowing for a plurality of sensors to acquire measurement data simultaneously by selectively coupling one of the plurality of sensors to the universal module at a time.

28. The measurement system of claim 23, further comprising a voltage divider circuit coupled to the one or more sensors to scale down the measurement data to a level that is compatible with the control circuit and the universal module.

29. The measurement system of claim 23, wherein the control circuit comprises a shift register for receiving sensor signature data from the one or more sensors, wherein the sensor signature data indicates the type of sensor providing measurement data to the universal module.

30. The measurement system of claim 23, wherein the control circuit comprises a memory wherein the memory contains calibration data associated with the one or more sensors, and wherein the particular calibration data for a sensor having measurement data transmitted to the universal module is also transmitted to the universal module for use in converting the measurement data acquired by the sensor.

31. The measurement system of claim 23, wherein the control circuit comprises a timing control circuit to provide synchronization between the input module and the universal module.

32. A method of interfacing a universal module to a plurality of measurement sensors, comprising the steps of:
coupling one of the measurement sensors to the universal module;
identifying the one of the measurement sensors; and
configuring the universal module in response to the identifying step, wherein the configuring includes selecting one of a plurality of available measurement conversion routines which is associated with the identified measurement sensor, thereby facilitating accurate and versatile measurement acquisition from a plurality of measurement sensors.

33. The method of claim 32, wherein the step of coupling one of the measurement sensors to the universal module comprises providing signal conditioning to measurement data associated with the one of the measurement sensors.

34. The method of claim 32, wherein the step of coupling one of the measurement sensors to the universal module comprises scaling down measurement data associated with the one of the measurement sensors to thereby make the measurement data compatible with the universal module.

35. The method of claim 32, wherein the step of coupling one of the measurement sensors to the universal module comprises multiplexing the plurality of sensors so that one of the plurality of sensors is selectively coupled to the universal module at a time.

36. The method of claim 32, wherein the step of identifying the one of the measurement sensors comprises reading an electronic signature associated with the one of the measurement sensors.

37. The method of claim 36, wherein the step of reading an electronic signature comprises accessing a memory storage device associated with the plurality of measurement sensors.

38. The method of claim 32, wherein the step of identifying the one of the measurement sensors comprises indicating to the universal module that a measurement has been taken by the one of measurement sensors.

39. The method of claim 32, wherein the step of identifying the one of the measurement sensors comprises identifying calibration data associated with the one of the measurement sensors.

40. The method of claim 32, wherein configuring the universal module comprises identifying measurement conversion instructions in response to identifying the one of the measurement sensors.

41. The method of claim 32, wherein configuring the universal module comprises accessing calibration data associated with the identified one of the measurement sensors.

42. The method of claim 32, wherein configuring the universal module comprises downloading signal conditioning or firmware instructions to the universal module which are unique to a type of sensor or precision range.

43. The method of claim 32, wherein configuring the universal module comprises debugging conversion instructions associated with the one of the measurement sensors.

* * * * *